United States Patent
Konno et al.

(10) Patent No.: US 11,762,192 B2
(45) Date of Patent: Sep. 19, 2023

(54) OPTICAL SCANNING DEVICE AND METHOD OF MANUFACTURING THE SAME

(71) Applicant: Mitsubishi Electric Corporation, Chiyoda-ku (JP)

(72) Inventors: Nobuaki Konno, Chiyoda-ku (JP); Yoshiaki Hirata, Chiyoda-ku (JP); Takahiko Ito, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 911 days.

(21) Appl. No.: 16/483,207

(22) PCT Filed: Dec. 1, 2017

(86) PCT No.: PCT/JP2017/043302
§ 371 (c)(1),
(2) Date: Aug. 2, 2019

(87) PCT Pub. No.: WO2018/179589
PCT Pub. Date: Oct. 4, 2018

(65) Prior Publication Data
US 2020/0233205 A1 Jul. 23, 2020

(30) Foreign Application Priority Data
Mar. 30, 2017 (JP) .................. 2017-068105

(51) Int. Cl.
*G02B 26/08* (2006.01)
*G02B 26/10* (2006.01)
(Continued)

(52) U.S. Cl.
CPC ....... *G02B 26/0858* (2013.01); *G02B 26/105* (2013.01); *H10N 30/01* (2023.02);
(Continued)

(58) Field of Classification Search
None
See application file for complete search history.

(56) References Cited

U.S. PATENT DOCUMENTS

2007/0228871 A1 10/2007 Aoki et al.
2011/0181933 A1 7/2011 Kubo et al.
(Continued)

FOREIGN PATENT DOCUMENTS

JP H0523331 A * 2/1993
JP 2013-80068 A 5/2013
(Continued)

OTHER PUBLICATIONS

International Search Report dated Feb. 6, 2018 in PCT/JP2017/043302 filed on Dec. 1, 2017.
(Continued)

*Primary Examiner* — Erica S Lin
(74) *Attorney, Agent, or Firm* — XSENSUS LLP

(57) ABSTRACT

An optical scanning device includes a mirror and a drive beam. The drive beam includes a piezoelectric portion. The piezoelectric portion is partitioned by a plurality of first grooves into a plurality of piezoelectric bodies. The piezoelectric bodies are reduced in length in an X-axis direction as the piezoelectric bodies approach one end side connected to an anchor. The piezoelectric bodies are reduced in length in the X-axis direction as the piezoelectric bodies approach the other end side connected to a link beam.

14 Claims, 19 Drawing Sheets

(51) Int. Cl.
*H10N 30/01* (2023.01)
*H10N 30/87* (2023.01)
*H10N 30/00* (2023.01)
*H10N 30/20* (2023.01)

(52) U.S. Cl.
CPC ..... *H10N 30/1051* (2023.02); *H10N 30/2042* (2023.02); *H10N 30/872* (2023.02)

(56) References Cited

U.S. PATENT DOCUMENTS

| | | |
|---|---|---|
| 2013/0002095 A1 | 1/2013 | Van Der Linden |
| 2014/0285067 A1 | 9/2014 | Li et al. |
| 2014/0300942 A1* | 10/2014 | Van Lierop .......... G02B 26/105 359/198.1 |
| 2015/0103386 A1 | 4/2015 | Tanaka et al. |
| 2015/0309307 A1 | 10/2015 | Naono |
| 2016/0025964 A1* | 1/2016 | To ..................... G02B 26/0858 359/221.2 |

FOREIGN PATENT DOCUMENTS

| | | |
|---|---|---|
| JP | 2014-092630 A | 5/2014 |
| JP | 2015-22065 A | 2/2015 |
| WO | WO2010/035759 A1 | 4/2010 |

OTHER PUBLICATIONS

Supplementary European Search Report dated Feb. 19, 2020 in European Patent Application No. 17903018.4, 9 pages.

* cited by examiner

OPTICAL SCANNING DEVICE AND METHOD OF MANUFACTURING THE SAME

TECHNICAL FIELD

The present invention relates to an optical scanning device and a method of manufacturing the same, and particularly to an optical scanning device including a drive beam, and a method of manufacturing the optical scanning device.

BACKGROUND ART

Conventionally, there is a known optical scanning device in which a drive beam supporting a mirror is driven so as to change the reflecting direction of light incident upon the mirror. For example, in the optical scanning device disclosed in PTL 1, a mirror portion is supported by two torsion bars. The mirror portion is provided with a mirror reflection surface. Between the mirror reflection surface and the torsion bars, a stress alleviation region is provided in order to alleviate the stress applied to the mirror portion. The stress alleviation region is provided with an arc-shaped slit.

Furthermore, in an optical scanner disclosed in PTL 2, a mirror is held by a mirror frame so as to be vibratable. A unimorph holds the mirror frame through a shaft portion so as to be vibratable. The shaft portion is provided with a connecting section. The mirror frame is provided with an adjustment member for adjusting the moment of inertia of the mirror frame in order to alleviate the stress that acts on the connecting section.

In a mirror drive device disclosed in PTL 3, a mirror portion having a reflection surface is supported by a torsion bar. The torsion bar is connected to a piezoelectric actuator unit. The piezoelectric actuator unit is provided with a piezoelectric conversion unit configured to displace the piezoelectric actuator unit. In the piezoelectric conversion unit, electrodes are arranged in a partitioned manner in accordance with the stress of a piezoelectric body in order to efficiently drive the piezoelectric actuator unit.

CITATION LIST

Patent Literature

PTL 1: Japanese Patent Laying-Open No. 2013-80068
PTL 2: Japanese Patent National Publication No. 2010-035759
PTL 3: Japanese Patent Laying-Open No. 2015-22065

SUMMARY OF INVENTION

Technical Problem

As described above, there has conventionally been a proposal for an optical scanning device and the like to have a structure in consideration of the stress acting on the member for supporting a movable mirror.

The present invention has been made as part of a development for the above-described proposal. One object of the present invention is to provide an optical scanning device that allows alleviation of the stress that acts on a piezoelectric body for driving a drive beam. Another object of the present invention is to provide a method of manufacturing such an optical scanning device.

Solution to Problem

An optical scanning device according to the present invention includes: a reflector and a drive beam. The reflector has a reflection surface on which light is reflected. The drive beam has one end and the other end, the one end being fixed as a fixed end, and the other end being connected as a drive end to the reflector through a link beam. The drive beam includes a beam body and a piezoelectric portion. The beam body has a width in a first direction and extends from the one end to the other end in a second direction crossing the first direction. The piezoelectric portion is formed to be in contact with the beam body. The piezoelectric portion is partitioned by grooves to include a plurality of piezoelectric bodies, the grooves including a plurality of first grooves that extend in the first direction and that are spaced apart from each other in the second direction. The piezoelectric bodies are disposed to be reduced in length in the second direction as the piezoelectric bodies approach the fixed end, and the piezoelectric bodies are disposed to be reduced in length in the second direction as the piezoelectric bodies approach the drive end.

A method of manufacturing an optical scanning device according to the present invention is a method of manufacturing an optical scanning device including a drive beam configured to drive a reflector through a link beam, the reflector having a reflection surface on which light is reflected. Forming the drive beam and the reflector includes: preparing a substrate; forming a first conductive film so as to cover the substrate; forming a piezoelectric film so as to cover the first conductive film; forming a second conductive film so as to cover the piezoelectric film; by processing each of the second conductive film, the piezoelectric film and the first conductive film, forming a piezoelectric portion including piezoelectric bodies; and, by processing the substrate, forming the reflector and the link beam, and forming a beam body having one end that is fixed to the substrate and the other end that is connected to the reflector through the link beam, the beam body being in contact with the piezoelectric portion. The forming a piezoelectric portion includes obtaining the piezoelectric bodies partitioned by providing grooves in the piezoelectric film, the grooves including a plurality of first grooves that extend in a first direction and that are spaced apart from each other in a second direction crossing the first direction. In the obtaining the piezoelectric bodies partitioned by providing grooves, the piezoelectric bodies are disposed to be reduced in length in the second direction as the piezoelectric bodies approach a portion on a side of the one end of the beam body, and the piezoelectric bodies are disposed to be reduced in length in the second direction as the piezoelectric bodies approach a portion on a side of the other end of the beam body.

Advantageous Effects of Invention

According to the optical scanning device of the present invention, the piezoelectric portion is partitioned by grooves into a plurality of piezoelectric bodies such that the piezoelectric bodies are reduced in length in the second direction as the piezoelectric bodies approach the fixed end, and such that the piezoelectric bodies are reduced in length in the second direction as the piezoelectric bodies approach the drive end. Thereby, the stress acting on each piezoelectric body for driving the drive beam can be alleviated.

According to the method of manufacturing an optical scanning device of the present invention, in the obtaining the piezoelectric bodies partitioned by providing grooves, the piezoelectric bodies are disposed to be reduced in length in the second direction as the piezoelectric bodies approach a portion on the side of one end of the beam body, and the piezoelectric bodies are disposed to be reduced in length in the second direction as the piezoelectric bodies approach a portion on the side of the other end of the beam body. Thereby, it becomes possible to manufacture an optical scanning device that allows alleviation of the stress acting on each piezoelectric body for driving the drive beam.

DESCRIPTION OF EMBODIMENTS

First Embodiment

An optical scanning device according to the first embodiment will be hereinafter described.

Figure 1:
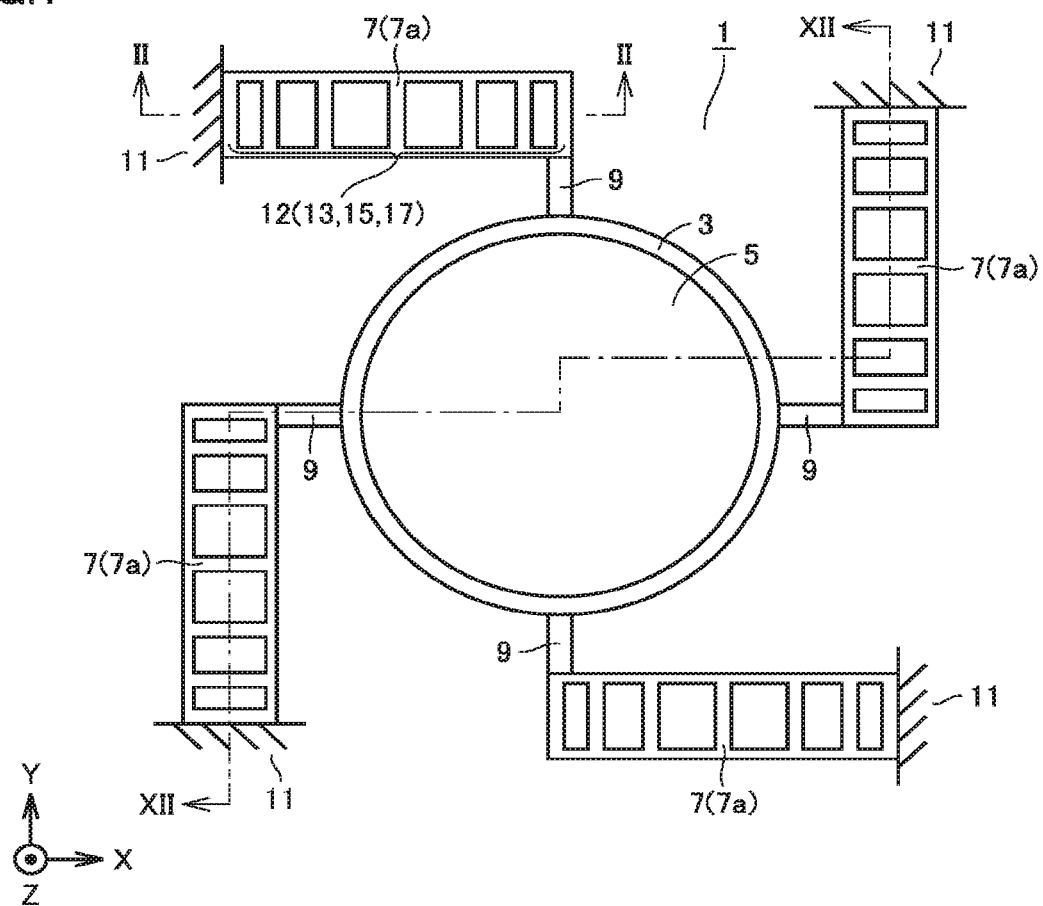
FIG. 1 is a plan view of an optical scanning device according to the first embodiment of the present invention.

As shown in FIG. 1, an optical scanning device 1 includes a mirror 3 provided with a reflecting mirror 5, and four drive beams 7 that are configured to change the direction of mirror 3. Each of drive beams 7 has a width and extends in a strip shape. One end of drive beam 7 in the longitudinal direction is fixed as a fixed end to an anchor 11. The other end of drive beam 7 in the longitudinal direction is connected as a drive end to mirror 3 through a link beam 9. Link beam 9 is attached to each of four positions at which the outer circumference of mirror 3 is partitioned into four approximately equal parts. Link beam 9 is connected to the drive end of beam body 7a from the short-side direction of drive beam 7.

Then, the structure of drive beam 7 will be described in greater detail. As shown in FIG. 1, an explanation will be hereinafter given using an X-axis, a Y-axis, and a Z-axis for convenience of explanation about directions and the like. The surface (the surface of the sheet of paper) on which optical scanning device 1 is disposed is defined as a X-Y plane. The Z-axis is orthogonal to the X-Y plane. Drive beam 7 shown taken along a cross-sectional line II-II will be described by way of example.

Figure 2:
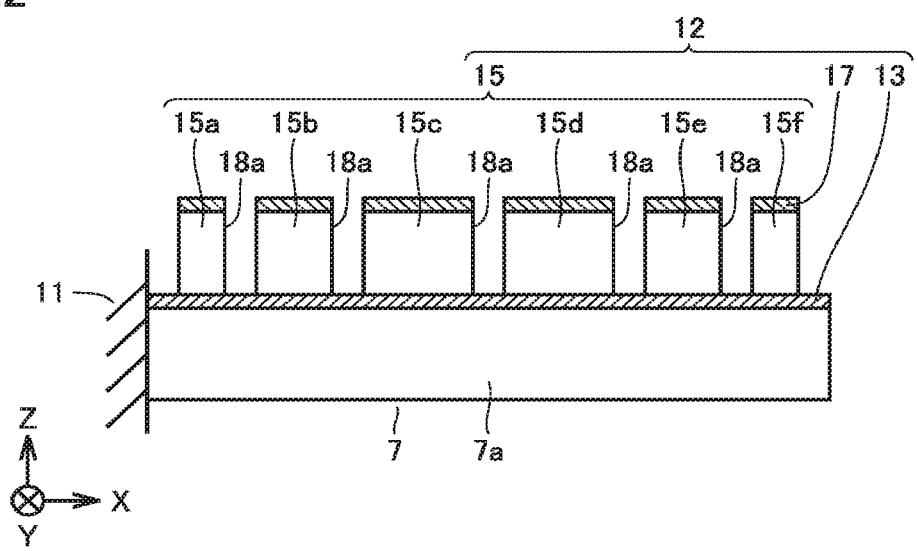
FIG. 2 is a cross-sectional view taken along a cross-sectional line IT-II shown in FIG. 1 in the first embodiment.

As shown in FIGS. 1 and 2, drive beam 7 includes beam body 7a and a piezoelectric portion 12. Piezoelectric portion 12 is formed so as to be in contact with beam body 7a. In FIG. 2, beam body 7a has a width in the Y-axis direction (the short-side direction), and extends in the X-axis direction (the long-side direction).

Piezoelectric portion 12 includes a lower electrode 13, a piezoelectric body 15, and an upper electrode 17. Drive beam 7 has a width of about 10 µm to 1000 µm. Drive beam 7 has a length of about 100 µm to 10000 µm. Furthermore, lower electrode 13 has a thickness of about 0.05 µm to 0.5 µm. Piezoelectric body 15 has a thickness of about 0.5 µm to 5 µm. Upper electrode 17 has a thickness of about 0.05 µm to 0.5 µm. In addition, an insulating film (not shown) is interposed between beam body 7a and lower electrode 13.

Piezoelectric portion 12 is partitioned into a plurality of piezoelectric bodies 15 by a plurality of first grooves 18a that extend in the Y-axis direction and that are spaced apart from each other in the X-axis direction. When drive beam 7 is driven, the stress acting on each of piezoelectric body 15 disposed on the one end side of beam body 7a and piezoelectric body 15 disposed on the other end side of beam body 7a is greater than the stress acting on piezoelectric body 15 disposed in the center portion of beam body 7a in the long-side direction. The plurality of piezoelectric bodies 15 obtained by partitioning are designed such that piezoelectric bodies 15 receiving relatively higher stress are shorter in length in the X-axis direction than piezoelectric bodies 15 receiving relatively lower stress.

In other words, the plurality of piezoelectric bodies 15 obtained by partitioning are arranged to be shorter in length in the X-axis direction as the plurality of piezoelectric bodies 15 approach the one end side of beam body 7a connected to anchor 11. Also, the plurality of piezoelectric bodies 15 obtained by partitioning are arranged to be shorter in length in the X-axis direction as the plurality of piezoelectric bodies 15 approach the other end side of beam body 7a connected to link beam 9.

The following is a more specific explanation. As shown in FIG. 2, piezoelectric bodies 15c and 15d are disposed in the center portion of beam body 7a extending in the X-axis direction. Piezoelectric bodies 15a and 15b are disposed on the side of one end of beam body 7a. Piezoelectric bodies 15e and 15f are disposed on the side of the other end of beam body 7a. Piezoelectric bodies 15a and 15b each are shorter in length in the X-axis direction than piezoelectric bodies 15c and 15d. Furthermore, piezoelectric body 15a is shorter in length in the X-axis direction than piezoelectric body 15b. Piezoelectric bodies 15e and 15f each are shorter in length in the X-axis direction than piezoelectric bodies 15c and 15d. Furthermore, piezoelectric body 15f is shorter in length in the X-axis direction than piezoelectric body 15e.

Mirror 3, drive beam 7, link beam 9, and anchor 11 each are made of a material mainly of silicon. Examples of applicable silicon may be silicon of a silicon-on-insulator (SO) substrate. By using a SOI substrate, the thickness of each of mirror 3 and drive beam 7 can be changed. By increasing the thickness of mirror 3, deformation of mirror 3 can be suppressed. On the other hand, by reducing the thickness of drive beam 7, its rigidity is decreased, so that the amount of displacement can be increased. Furthermore, examples of applicable silicon may be polysilicon in addition to single-crystal silicon.

Reflecting mirror 5 is formed of a metal film having relatively high reflectance. As such a metal film, an Au (gold) film is suitable, for example. When a gold film is directly formed on the surface of silicon, the Au film is more likely to peel off from the surface of silicon since the adhesiveness between the Au film and silicon is low. Thus, it is desirable to interpose an adhesion layer between the Au film and the surface of silicon. For example, an adhesion layer may preferably be a laminate film such as a Cr (chromium film)/a Ni (nickel) film/an Au film, or a Ti (titanium) film/a Pt (platinum) film/an Au film. Reflecting mirror 5 has a diameter of about 100 μm to 10000 μm.

As a metal film of reflecting mirror 5, for example, a Pt (platinum) film, an Ag (silver) film or the like may be applicable in addition to an Au film. It is preferable that a metal film having a higher reflectance is applied in accordance with the wavelength of the light to be used. Furthermore, as optical scanning device 1, a structure body including mirror 3 may be packaged, for example, by hermetic sealing such as vacuum sealing. In such a case, mirror 3 can also be formed by an easily-oxidizable material, for example, an Al (aluminum) film and the like.

As the above-mentioned method of forming a metal film, for example, a sputtering method is suitable for film formation. The metal film formed by the sputtering method achieves excellent film quality. In addition to the sputtering method, for example, a vapor deposition method and the like may also be used for film formation.

As a material of piezoelectric body 15, lead zirconate titanate (PZT: Pb (Zr, Ti) $O_3$) having a high piezoelectric constant is suitable. As a material of piezoelectric body 15, any material having a piezoelectric effect can be applied. In addition to lead zirconate titanate, for example, aluminum nitride (AlN), sodium potassium niobate (KNN: (K, Na) $NbO_3$) or the like may be applicable.

Then, as an example of the method of manufacturing optical scanning device 1 described above, a manufacturing method using an SOI substrate will be hereinafter explained.

Figure 3:
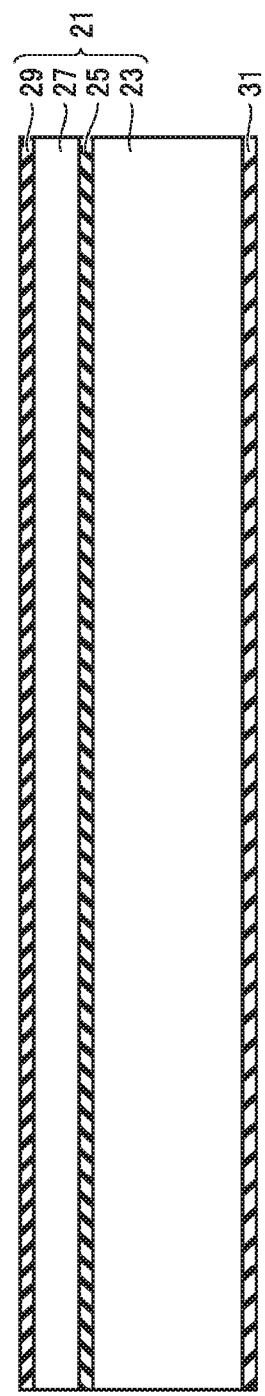
FIG. 3 is a cross-sectional view taken along a cross-sectional line corresponding to a cross-sectional line XII-XII shown in FIG. 1, which shows one step of a method of manufacturing an optical scanning device in the first embodiment.

As shown in FIG. 3, an SOI substrate 21 is first prepared. In SOI substrate 21, a silicon layer 27 (an active layer) is formed on the front-side surface of a silicon substrate 23 (a substrate wafer) with a silicon oxide film 25 (an intermediate layer) interposed therebetween. On the front-side surface of silicon layer 27, a silicon oxide film 29 is formed. Also, a silicon oxide film 31 is formed on the backside surface of silicon substrate 23. Silicon substrate 23 has a thickness of about 100 μm to 1000 μm. Silicon layer 27 has a thickness of about 2 μm to 200 μm.

When silicon oxide films 29 and 31 are not formed on the front-side surface and the backside surface, respectively, of SOI substrate 21, silicon oxide film 29 is formed in advance on the front-side surface of silicon layer 27, and silicon oxide film 31 is formed in advance on the backside surface of silicon substrate 23. Silicon oxide films 29 and 31 may be formed by various methods, but are suitably formed by a thermal oxidation method. By a thermal oxidation method, a silicon oxide film with excellent film quality can be formed on each of the front-side surface and the backside surface of SOI substrate 21. In addition to a SOI substrate, a single-crystal silicon substrate may be applicable. In this case, etching on the backside surface of the substrate, which will be described later, needs to be controlled by time.

Figure 4:
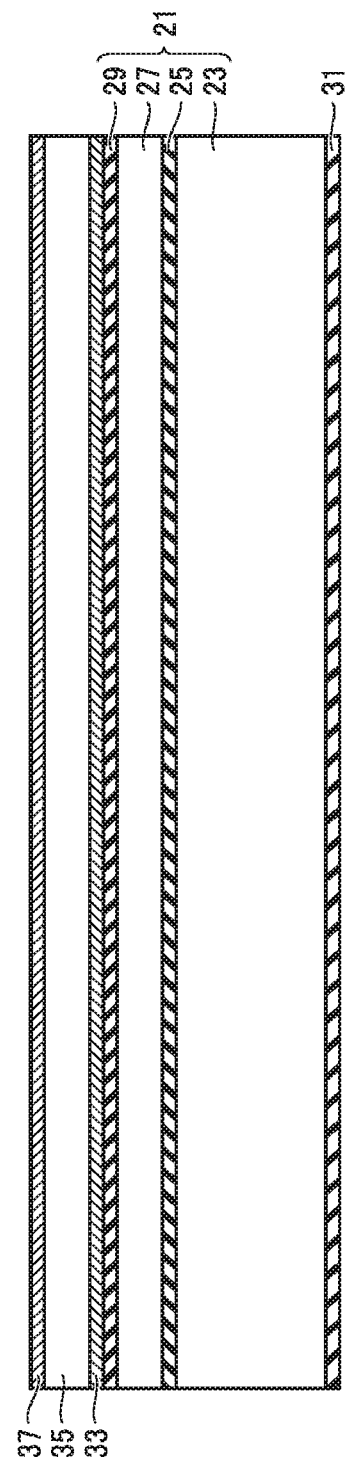
FIG. 4 is a cross-sectional view showing the step carried out after the step shown in FIG. 3 in the first embodiment.

Then, each of films serving as a piezoelectric portion is formed on the front-side surface of SOI substrate 21. As shown in FIG. 4, a first conductive film 33 serving as a lower electrode is formed so as to cover the front-side surface of silicon oxide film 29. Then, a piezoelectric film 35 serving as a piezoelectric body is formed so as to cover first conductive film 33. Then, a second conductive film 37 serving as an upper electrode is formed so as to cover piezoelectric film 35.

Each of first conductive film 33 and second conductive film 37 is preferably a laminate film (Ti/Pt) of a Ti (titanium) film and a Pt (platinum) film, for example. This laminate film is commonly used as a drive electrode of a piezoelectric body. In addition to this laminate film, a film that can be electrically energized and that can ensure the adhesiveness with the films located thereabove and therebelow may be applicable. As piezoelectric film 35, PZT is preferable as described above, but AlN, KNN or the like may also be applicable. As the method of forming piezoelectric film 35, a sputtering method that can achieve excellent film quality is preferable. When PZT is applied for piezoelectric film 35, a sol-gel method or the like may be used for film formation.

Figure 5:
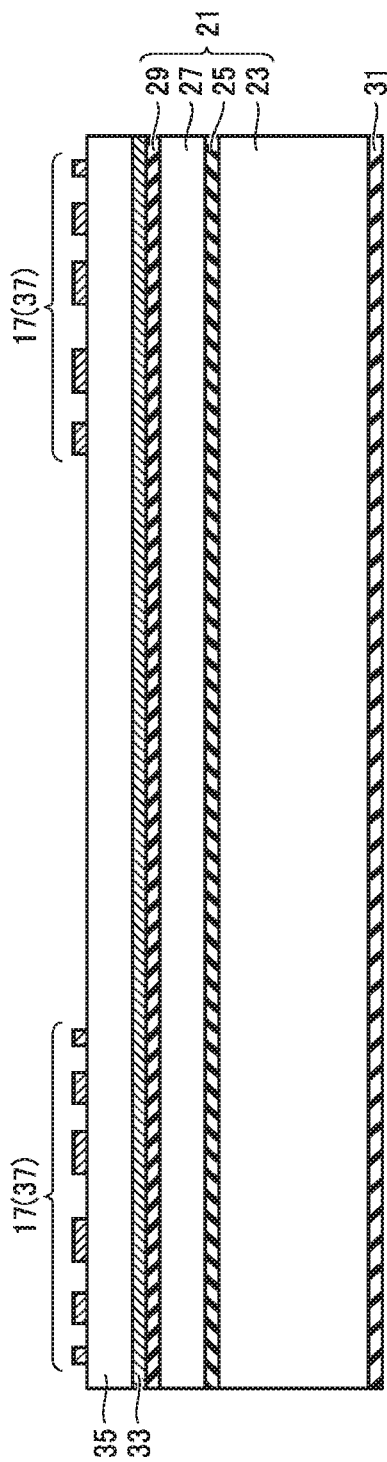
FIG. 5 is a cross-sectional view showing the step carried out after the step shown in FIG. 4 in the first embodiment.

Then, second conductive film 37 is patterned, thereby forming upper electrode 17, as shown in FIG. 5. It is suitable to perform patterning by a reactive ion etching (RIE) method. It is suitable to use a resist as a protective film for etching. In addition to the RIE method, a wet etching method using an etchant may be applicable.

In any of the etching methods, it is necessary to employ the conditions (gas, solutions, and the like) under which piezoelectric film 35 located below second conductive film 37 is less likely to be etched. When the RIE method is applied, it is suitable to use $Cl_2$/Ar-based gas. After upper electrode 17 is formed, the resist is removed. As a method of removing a resist, $O_2$ ashing is suitable. Furthermore, the resist may be removed using a peeling solution.

Figure 6:
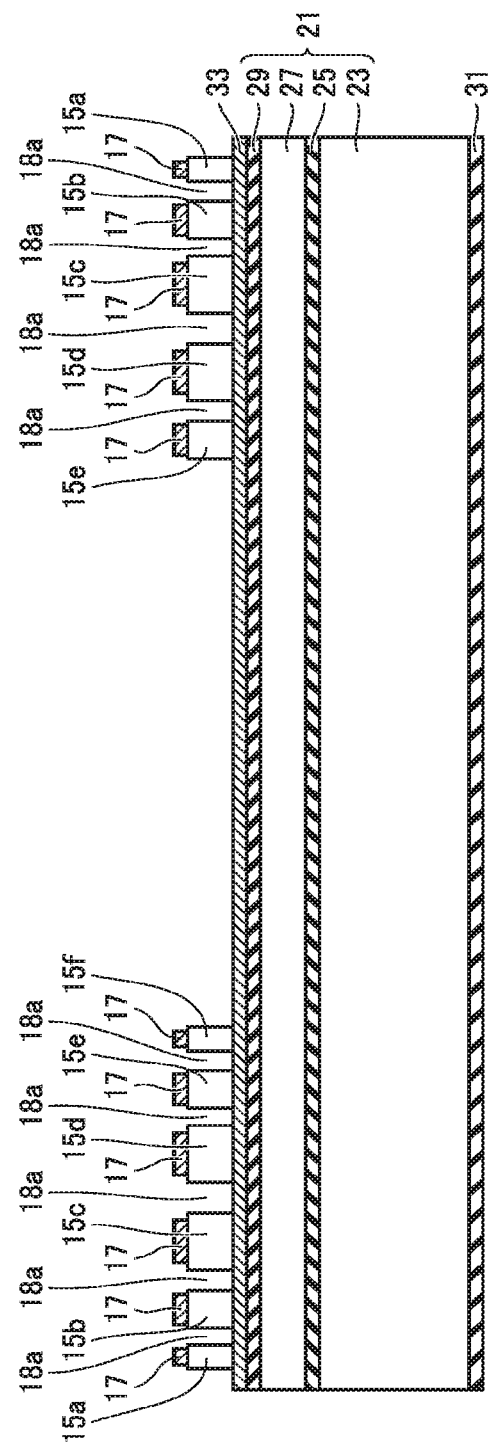
FIG. 6 is a cross-sectional view showing the step carried out after the step shown in FIG. 5 in the first embodiment.

Then, piezoelectric film 35 is patterned, thereby forming piezoelectric bodies 15 (15*a* to 15*f*), as shown in FIG. 6. In this case, first groove 18*a* is formed such that each piezoelectric body 15 is formed to have a desired length in the X-axis direction (the long-side direction of the drive beam). Here, first groove 18*a* is formed so as to reach first conductive film 33. It is suitable to perform patterning by the RIE method. As a protective film for etching, it is suitable to use a resist. In addition to the RIE method, a wet etching method may also be applicable.

In any of the etching methods, it is necessary to employ the conditions (gas, solutions, and the like) under which first conductive film 33 located below piezoelectric film 35 is less likely to be etched. When PZT is applied for piezoelectric film 35 and patterning is performed by the RIE method, it is suitable to use $Cl_2$/$BCl_3$/$CH_4$-based gas. After piezoelectric body 15 is formed, the resist is removed.

Figure 7:
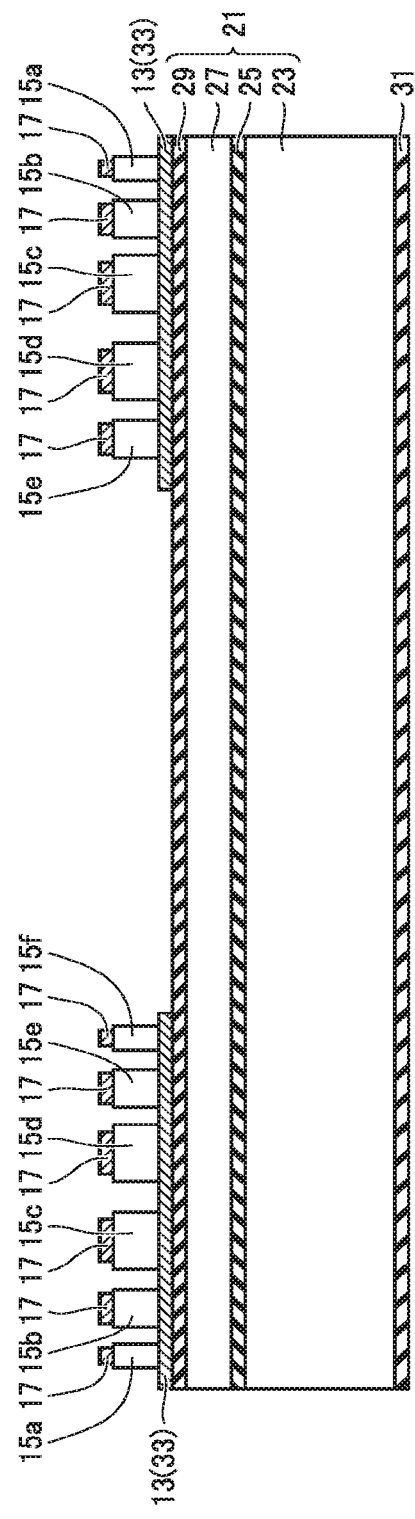
FIG. 7 is a cross-sectional view showing the step carried out after the step shown in FIG. 6 in the first embodiment.

Then, first conductive film 33 is patterned, thereby forming lower electrode 13, as shown in FIG. 7. It is suitable to perform patterning by the RIE method. As a protective film for etching, it is suitable to use a resist. In addition to the RTE method, a wet etching method may also be applicable.

In any of the etching methods, it is necessary to employ the conditions (gas, solutions, and the like) under which silicon oxide film 29 located below first conductive film 33 is less likely to be etched. When the RIE method is applied, it is suitable to use $Cl_2$/Ar-based gas. After lower electrode 13 is formed, the resist is removed.

The above manufacturing method has been explained with regard to the case where films serving as a piezoelectric portion are first stacked, which are then sequentially patterned, thereby forming a piezoelectric portion. In addition, patterning may be performed for each of the films that are to serve as a piezoelectric portion. In this case, a lift-off method may be applied for formation.

Figure 8:
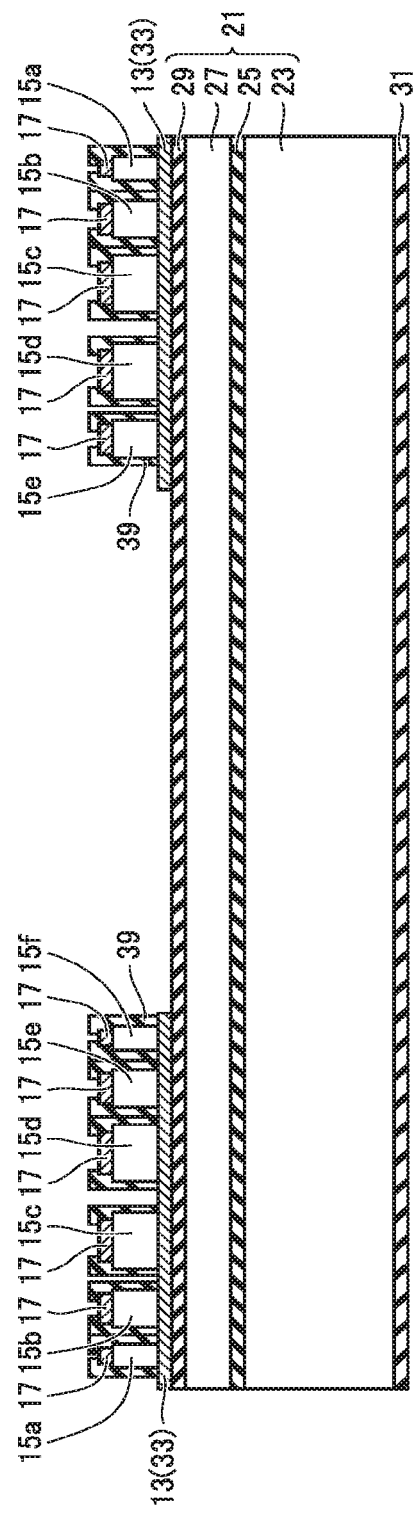
FIG. 8 is a cross-sectional view showing the step carried out after the step shown in FIG. 7 in the first embodiment.

Then, an insulating film (not shown) is formed so as to cover piezoelectric body 15, upper electrode 17 and the like. Then, the insulating film is patterned, thereby forming an insulating film 39 as shown in FIG. 8. Insulating film 39 is formed so as to cover piezoelectric body 15 such that upper electrode 17 is exposed.

As insulating film 39, for example, it is suitable to use a silicon oxide film, a silicon nitride film, a silicon oxide-nitride film, or the like. Lower electrode 13 and upper electrode 17 each are formed of a metal film while piezoelectric body 15 is formed of a piezoelectric film. Accordingly, it is preferable that insulating film 39 is formed at a relatively low temperature. As insulating film 39 formed at a low temperature, a tetra ethyl ortho silicate (TEOS)-based oxide film is suitable.

When upper electrode 17 is formed of a laminate film of a Ti film/a Pt film, the adhesiveness between the Pt film and the TEOS-based oxide film may be low though dependent on the internal stress or the film quality. In this case, in order to improve the adhesiveness therebetween, it is preferable to form a Ti film on a Pt film, and it is preferable that upper electrode 17 is formed of a laminate film of a Ti film/a Pt film/a Ti film. It is suitable to perform patterning by the RIE method. As a protective film for etching, it is suitable to use a resist. In addition to the RIE method, a wet etching method may also be applicable.

In any of the etching methods, it is necessary to employ the conditions (gas, solutions, and the like) under which silicon oxide film 29 located below insulating film 39 is less likely to be etched. When patterning is performed by the RIE method, it is suitable to use $CF_4$-based gas. After insulating film 39 is patterned, the resist is removed.

Figure 9:
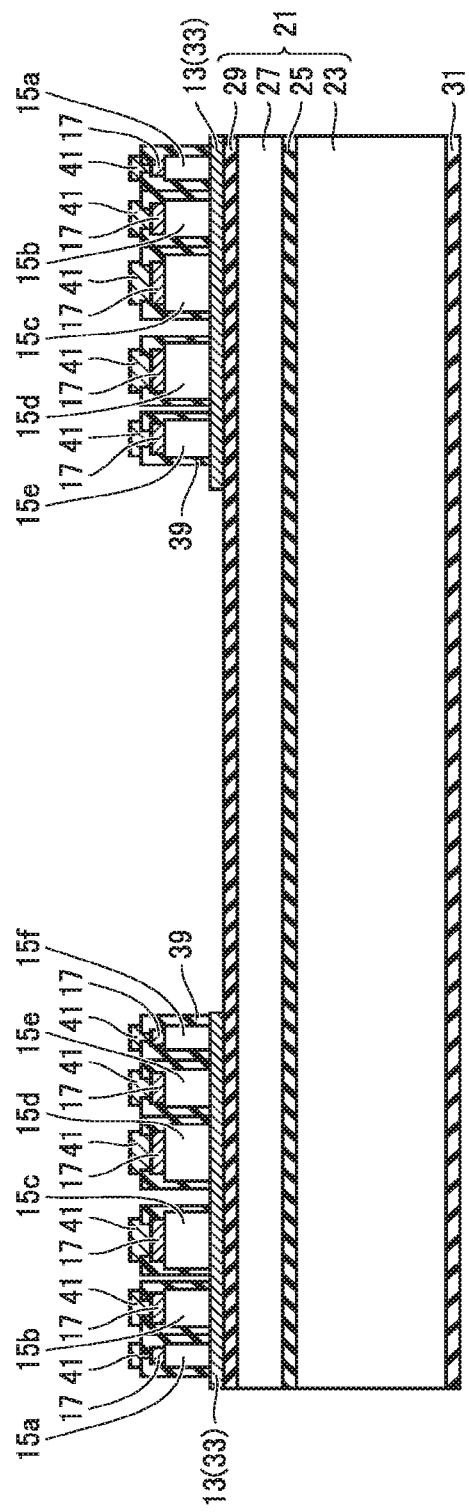
FIG. 9 is a cross-sectional view showing the step carried out after the step shown in FIG. 8 in the first embodiment.

Then, a conductive film (not shown) is formed so as to cover the exposed surface of upper electrode 17. Then, the conductive film is patterned, thereby forming a wiring electrode 41 as shown in FIG. 9. As a conductive film, for example, a laminate film of a Ti film/a Pt film and the like is preferable as in the case of upper electrode 17 and the like. Furthermore, it is preferable that the conductive film is formed by the sputtering method. It is suitable to perform patterning by the RIE method. As a protective film for etching, it is suitable to use a resist. In addition to the RIE method, a wet etching method may also be applicable.

In any of the etching methods, it is necessary to employ the conditions (gas, solutions, and the like) under which insulating film 39 located below the conductive film to be formed as wiring electrode 41 is less likely to be etched. When patterning is performed by the RIE method, it is suitable to use $Cl_2$/Ar-based gas. After wiring electrode 41 is patterned, the resist is removed.

Figure 10:
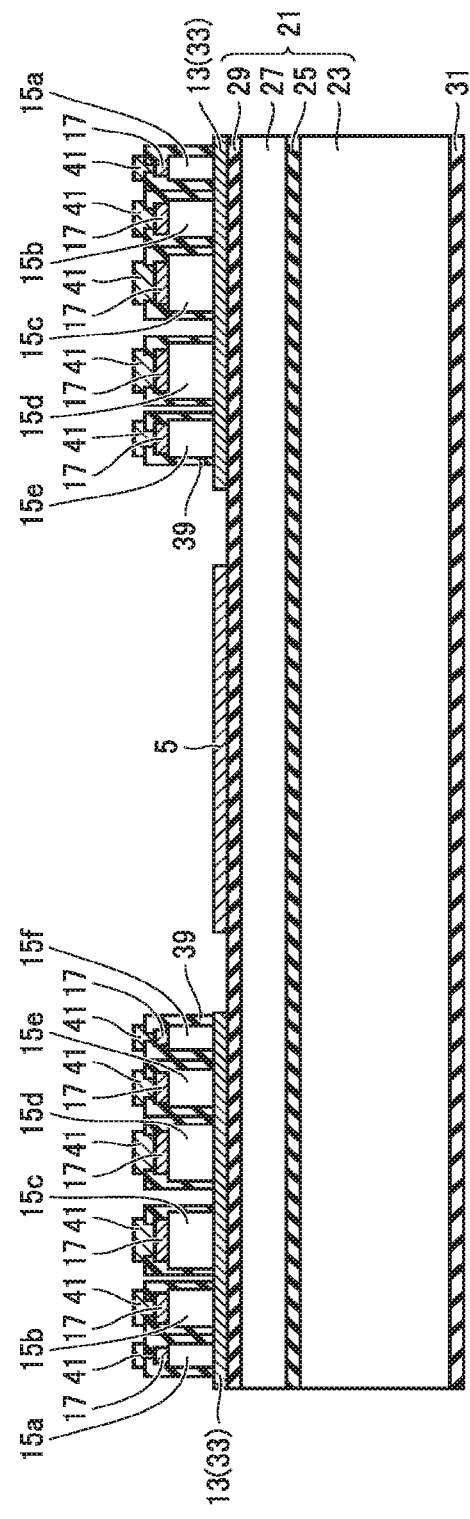
FIG. 10 is a cross-sectional view showing the step carried out after the step shown in FIG. 9 in the first embodiment.

Then, a film (not shown) serving as a reflecting mirror is formed so as to cover silicon oxide film 29 and the like. Then, the film is patterned, thereby forming reflecting mirror 5 as shown in FIG. 10. As a film serving as a reflecting mirror, for example, a laminate film such as a Cr film/a Ni film/an Au film or a Ti film/a Pt film/an Au film is suitable. This laminate film has excellent adhesiveness with the base layer and has high reflectance. It is also preferable that the laminate film is formed by the sputtering method.

When the Au film is formed, wet etching by an etchant is preferable. In addition, a lift-off method may also be applicable for film formation. Furthermore, an ion beam etching (IBE) method may also be employed for film formation. After reflecting mirror 5 is patterned, the resist is removed.

In addition, wiring electrode 41 and reflecting mirror 5 may be simultaneously formed. In this case, it is preferable to form a film that can be used for both wiring electrode 41 and reflecting mirror 5. It is preferable to form wiring electrode 41 in accordance with the conditions (film types, patterning, and the like) under which reflecting mirror 5 is formed.

Figure 11:
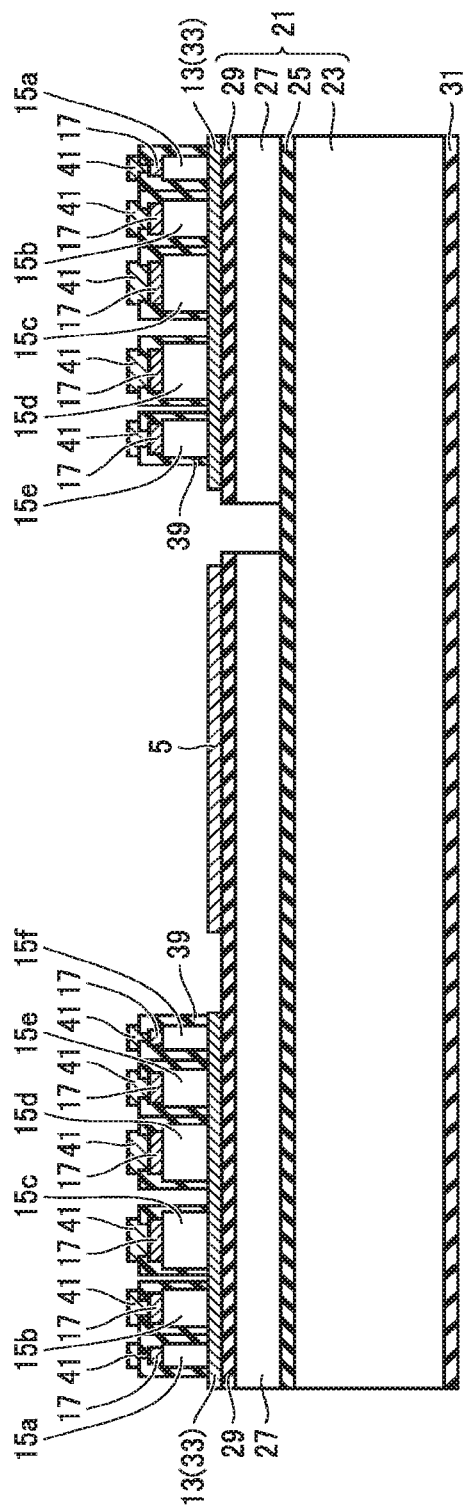
FIG. 11 is a cross-sectional view showing the step carried out after the step shown in FIG. 10 in the first embodiment.

Then, the portion to be formed as a front-side surface of optical scanning device 1 is processed. Silicon oxide film 29 is patterned as shown in FIG. 11. It is suitable to pattern silicon oxide film 29 by the RIE method. When the RIE method is applied, it is suitable to use $Cl_4$-based gas. As a protective film for etching, it is suitable to use a resist. In addition to the RIE method, a wet etching method may also be applicable.

Then, silicon layer 27 is etched. Etching is performed using silicon oxide film 29 and the resist used for patterning silicon oxide film 29, each as a protective film. It is suitable to perform etching by the inductive coupling plasma-RIE (ICP-RIE) method. Etching is performed until the surface of silicon oxide film 25 is exposed. The resist is removed after etching.

Then, the portion to be formed as a backside surface of optical scanning device 1 is processed. First, silicon oxide film 31 is patterned. It is suitable to perform patterning by the RIE method. As a protective film for etching, it is suitable to use a resist. When the RIE method is applied, it is suitable to use $Cl_4$-based gas. In addition to the RIE method, a wet etching method may also be applicable.

Figure 12:
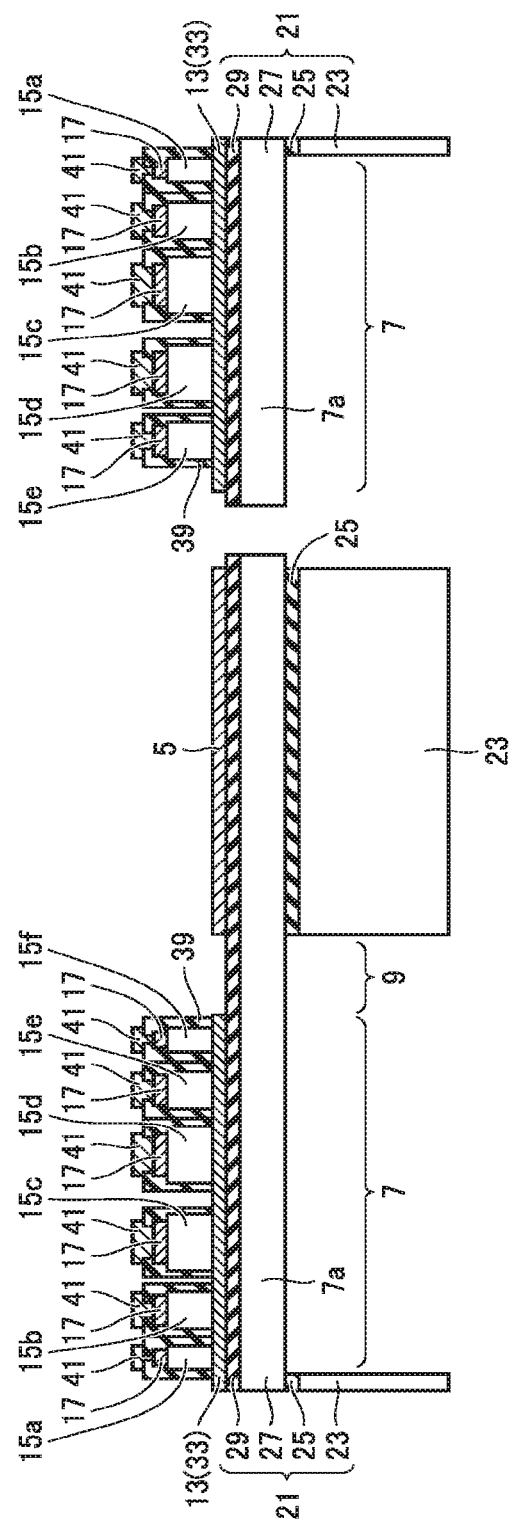
FIG. 12 is a cross-sectional view showing the step carried out after the step shown in FIG. 11 in the first embodiment.

Then, as shown in FIG. 12, silicon substrate 23 is etched. Etching is performed using the resist used for patterning silicon oxide film 31 as a protective film. It is suitable to perform etching by the ICP-RIE method.

Then, silicon oxide film 25 is etched. It is suitable to perform etching by the RIE method. When the RIE method is applied, it is suitable to use $CF_4$-based gas. The resist is removed after etching. Then, by dicing SOI substrate 21, optical scanning device 1 is completed.

Then, the operation of the above-described optical scanning device 1 will be described with reference to FIGS. 1 and 2. When a desired voltage is applied between lower electrode 13 and upper electrode 17 of piezoelectric portion 12, piezoelectric bodies 15 are expanded and contracted by the piezoelectric effect. In this case, optical scanning device 1 is configured in a monomorph structure in which piezoelectric portion 12 is formed on the surface of beam body 7a. Thus, drive beam 7 (beam body 7a) is to be displaced in the Z-axis direction. Drive beam 7 is displaced in the Z-axis direction, to thereby change the direction of mirror 3 through link beam 9. When the direction of mirror 3 is changed over time, the light reflected by mirror 3 can be caused to scan. Furthermore, by vibrating drive beam 7 at the frequency in the vicinity of the resonance frequency of optical scanning device 1, the operation causing a larger displacement can be achieved at a relatively lower voltage.

In optical scanning device 1 as described above, piezoelectric portion 12 is partitioned by first grooves 18a into piezoelectric bodies 15. The reason why piezoelectric bodies 15 are provided by partitioning will be described below.

Figure 13:
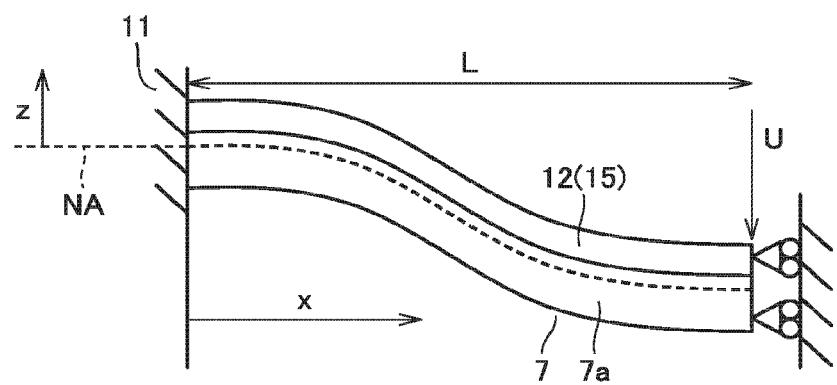
FIG. 13 is a side view for illustrating the stress acting on a drive beam in the first embodiment.

FIG. 13 schematically shows drive beam 7 in which piezoelectric portion 12 (piezoelectric body 15) is not partitioned. In the coordinates, the long-side direction and the height direction of drive beam 7 that is not displaced are defined as an X-axis and a Z-axis, respectively, as in FIG. 2. The Young's modulus of piezoelectric portion 12 (piezoelectric body 15) is defined as E, the length of drive beam 7 is defined as L, the displacement of the leading end (drive end) of drive beam 7 is defined as U, the distance from a neutral axis NA is defined as z, and the distance from anchor 11 is defined as x. Neutral axis NA represents an axis (plane) along which no compression stress and no tensile stress occur when a bending moment acts on drive beam 7. A stress σ occurring in piezoelectric portion 12 (piezoelectric body 15) is represented by the following (equation 1).

$$\sigma = 6Ez(2x-L)U/L^3 \qquad \text{(equation 1)}$$

According to the (equation 1) shown above, it turns out that stress σ generated in piezoelectric portion 12 (piezoelectric body 15) is 0 in the center (x=L/2) of drive beam 7 and is increased toward the fixed end (x=0) or the drive end (x=L) of drive beam 7. It also turns out that stress σ generated in piezoelectric portion 12 (piezoelectric body 15) is increased away from neutral axis NA and toward the surface of piezoelectric portion 12 (piezoelectric body 15). Accordingly, in the case where sufficient adhesiveness is achieved in the interface between lower electrode 13 and piezoelectric body 15 in drive beam 7, piezoelectric body 15 may be broken from its surface when the stress on the surface of piezoelectric body 15 exceeds the fracture stress of piezoelectric body 15.

Figure 14:
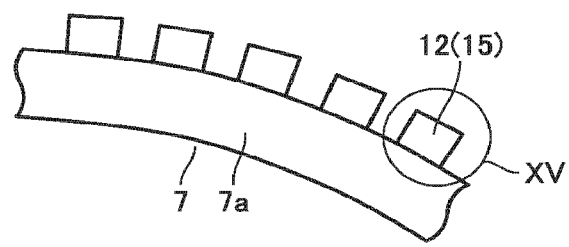
FIG. 14 is a partially enlarged side view for illustrating the stress acting on the drive beam in the present embodiment.
Figure 15:
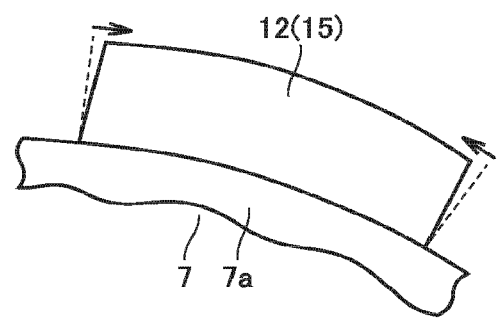
FIG. 15 is a partially enlarged side view of a portion surrounded by a region indicated as XV shown in FIG. 14 for illustrating the stress acting on the drive beam in the first embodiment.

Thus, in order to prevent piezoelectric body 15 from being broken from its surface, it is conceivable to partition piezoelectric portion 12 (piezoelectric body 15) into a plurality of portions as shown in FIGS. 14 and 15. By partitioning by first grooves 18a into a plurality of piezoelectric bodies 15, the surfaces (upper surfaces) of piezoelectric bodies 15 are rendered discontinuous, so that the stress occurring in piezoelectric portion 12 (piezoelectric body 15) can be reduced. As the partitioning length is shorter, the stress occurring in piezoelectric portion 12 (piezoelectric body 15) can be more reduced.

Figure 16:
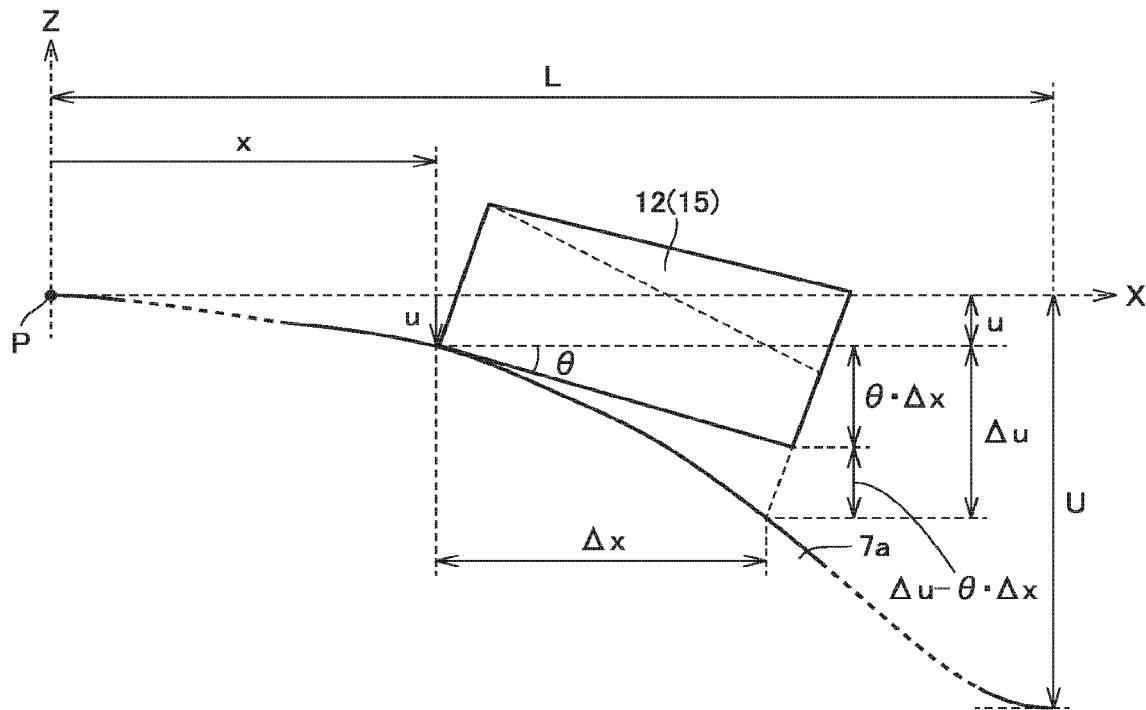
FIG. 16 is a partially enlarged side view showing coordinates and the length relation for illustrating the partitioning length along which a piezoelectric portion is partitioned, in the first embodiment.

Then, the partitioning length will be hereinafter described. FIG. 16 schematically shows partitioned piezoelectric portion 12 (piezoelectric body 15). Based on this figure, the length of piezoelectric portion 12 (piezoelectric body 15) is estimated. In this estimation, the influences caused by bending of beam body 7a and expansion and contraction of piezoelectric body 15 in the thickness direction are ignored.

The fixed end of drive beam 7 fixed to anchor 11 is assumed to be a reference position P, in which the position of the interface between piezoelectric portion 12 and beam body 7a is defined as reference position P. In the state where drive beam 7 is not displaced, the long-side direction in which drive beam 7 extends is defined as an X-axis, the height direction is defined as Z-axis, and the length of drive beam 7 in the X-axis direction is defined as L. Reference position P may be defined as a neutral axis.

Furthermore, in the state where drive beam 7 is displaced, the displacement from reference position P to the drive end (the interface) of drive beam 7 in the Z-axis direction is defined as U, the distance from reference position P in the X-axis direction is defined as x, and the displacement in the Z-axis direction from reference position P at distance x to the interface is defined as u. Displacement u is represented by the following (equation 2).

$$u = 2x^2U(3/2 - x/L)/L^2 \qquad \text{(equation 2)}$$

Based on this (equation 2), assuming that the partitioning length in the X-axis direction is defined as Δx, and that the displacement difference between the end on the fixed end side and the end on the drive end side in partitioned piezoelectric portion 12 (piezoelectric body 15) is defined as Δu, displacement difference Δu is represented by the following (equation 3).

$$\Delta u = 2U\Delta x\{3(2x+\Delta x)/2 - (3x^2 + 3x\Delta x + \Delta x^2)/L\}/L^2 \qquad \text{(equation 3)}$$

Then, assuming that the angle between the tangent line (contact surface) at a position x of the displaced drive beam 7 (beam body 7a) and the surface (X-axis) of drive beam 7 that is not displaced is defined as θ, angle θ is represented by the following (equation 4).

$$\theta = 6Ux(1 - x/L)/L^2 \qquad \text{(equation 4)}$$

Then, assuming that the strain of the partitioned piezoelectric portion 12 (piezoelectric body 15) is defined as γ, strain γ is represented by the following (equation 5) when angle θ is small.

$$\gamma = (\Delta u - \theta \Delta x)/\Delta x = \qquad \text{(equation 5)}$$
$$\Delta u/\Delta x - \theta = 2U\Delta x(3/2 - 3x/L - \Delta x/L)/L^2$$

Then, assuming that the modulus of transverse elasticity of piezoelectric portion 12 (piezoelectric body 15) is defined as G, and the shearing stress occurring in piezoelectric portion 12 (piezoelectric body 15) is defined as τ, shearing stress ti is represented by the following (equation 6).

$$\tau=\gamma G \quad \text{(equation 6)}$$

The length of partitioning piezoelectric portion 12 (piezoelectric body 15) may be set such that the value of this shearing stress τ does not exceed the fracture stress.

The above-described (equation 5) shows that the stress to occur can be reduced as partitioning length Δx is reduced. Furthermore, partitioning is provided such that this value becomes constant at each position x, thereby allowing constant generation of entire stress.

By solving the quadratic equations of the (equation 5) and the (equation 6), partitioning length Δx can be represented by the following (equation 7) in the range of $(L/2+(2L^3\tau/UG)^{1/2}/3) \leq x \leq L$.

$$\Delta x=[(3L/2-3x)-\{(3L/2-3x)^2-2L^3\tau/(UG)\}^{1/2}]/2 \quad \text{(equation 7)}$$

Figure 17:
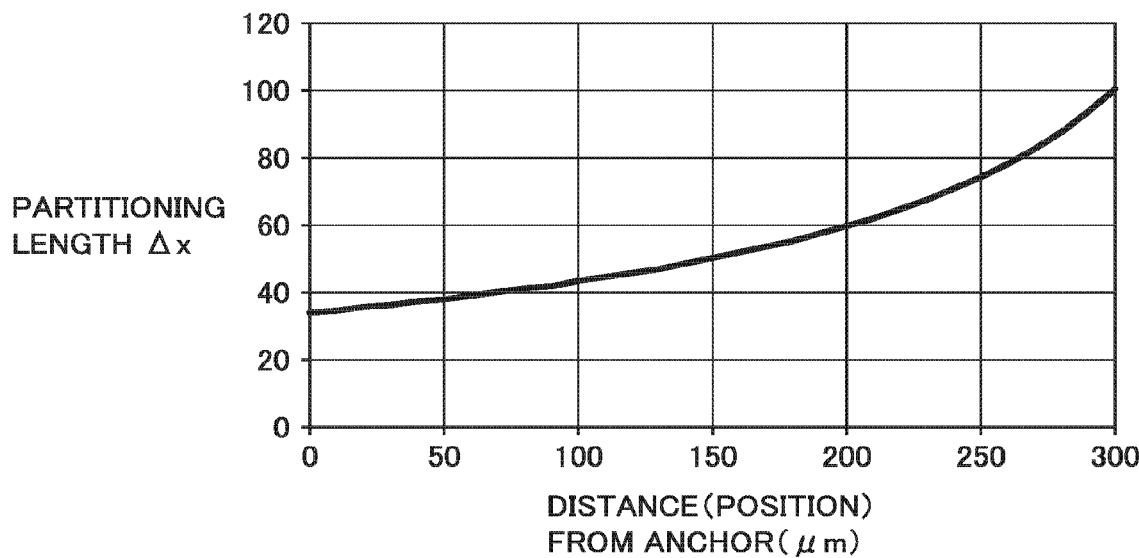
FIG. 17 is a graph showing the relation between the distance from an anchor in the drive beam and the partitioning length of the piezoelectric portion in the first embodiment.

In this case, FIG. 17 shows a graph representing the relation between distance x and partitioning length Δx, for example, in the case where length L of drive beam 7 is set at 1000 μm, displacement U of the drive end of the drive beam is set at 100 μm, modulus of transverse elasticity G is set at 29.85 GPa, and stress τ to be generated is set at 300 MPa. In order to suppress stress τ to be generated to be equal to or less than 300 MPa, the partitioning length at each position x may be set to be equal to or less than partitioning length Δx shown in the graph at position x. Also, the partitioning length may be reduced toward the fixed end as shown in the graph.

The above-described analysis is considered as effective when the partitioning length is relatively short and the influence caused by bending of drive beam 7 is small, as described above. It is practically preferable to conduct an analysis using a finite element method simulator and the like in consideration of the influence of the stress caused by bending of drive beam 7, the influence caused by expansion and contraction of drive beam 7 in the thickness direction, the effective driving force of drive beam 7, and the shape and the drive state of drive beam 7. In any case, as the partitioning length is more reduced, the stress occurring in piezoelectric portion 12 (piezoelectric body 15) can be more reduced.

While an analysis has been conducted for the fixed end side of drive beam 7 fixed to anchor 11, the similar analysis may be applicable also to the drive end side of drive beam 7 connected to link beam 9. Thus, the partitioning length of piezoelectric portion 12 (piezoelectric body 15) may be reduced as approaching the drive end.

Figure 18:
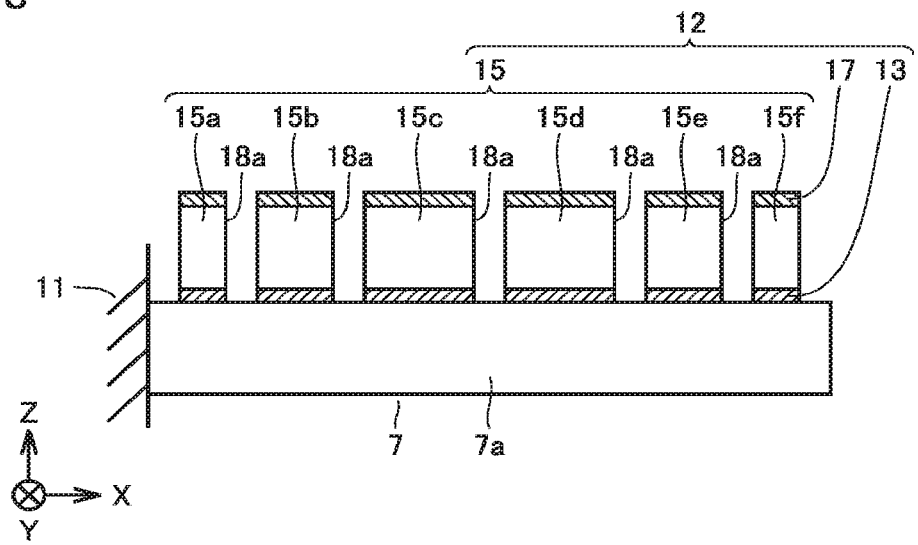
FIG. 18 is a cross-sectional view showing a drive beam of an optical scanning device according to a modification in the first embodiment.

The above optical scanning device 1 has been described with regard to the case where a common lower electrode 13 is formed for a plurality of piezoelectric bodies 15 obtained by partitioning, but lower electrode 13 may be provided for each of a plurality of piezoelectric bodies 15 obtained by partitioning, as shown in FIG. 18.

(Embodiment of Optical Scanning Device and Manufacturing Method Thereof)

1. The above-described optical scanning device 1 is implemented in the following embodiment.

Optical scanning device 1 includes: a reflector (3) having a reflection surface (5) on which light is reflected; and a drive beam (7) having one end and the other end, the one end being fixed as a fixed end, and the other end being connected as a drive end to the reflector (3) through a link beam (9).

The drive beam (7) includes: a beam body (7a) having a width in a first direction and extending from the one end to the other end in a second direction crossing the first direction; and a piezoelectric portion (12) formed to be in contact with the beam body (7a).

The piezoelectric portion (12) is partitioned (15) by grooves (18a, 18b) to include a plurality of piezoelectric bodies (15), the grooves (18a, 18b) including a plurality of first grooves (18a) that extend in the first direction and that are spaced apart from each other in the second direction.

The piezoelectric bodies (15) are disposed to be reduced in length in the second direction as the piezoelectric bodies (15) approach the fixed end, and the piezoelectric bodies (15) are reduced in length in the second direction as the piezoelectric bodies (15) approach the drive end.

According to the above-described embodiment, the stress that acts on each piezoelectric body (15) for driving the drive beam (7) can be alleviated.

2. Furthermore, the above-described optical scanning device 1 includes the following embodiment.

While the fixed end in the drive beam (7) is defined as a reference position, it is assumed that, in a state where the drive beam (7) is not displaced, the second direction in which the drive beam (7) extends is defined as an X-axis direction, a direction crossing the first direction and the second direction is defined as a Z-axis direction, a length of the drive beam (7) in the X-axis direction is defined as L, and a distance from the reference position in the X-axis direction is defined as x.

It is assumed that, in a state where the drive beam (7) is displaced, a displacement from the reference position to the drive end in the Z-axis direction is defined as U, a modulus of transverse elasticity of each of the piezoelectric bodies (15) is defined as G, a shearing stress occurring in each of the piezoelectric bodies (15) is defined as τ, and a length of each of the piezoelectric bodies (15) in the X-axis direction that are obtained by partitioning and located at the distance x is defined as Δx.

The Δx is set to be equal to or less than a length calculated by the following equation:

$$\Delta x=[(3L/2-3x)-\{(3L/2-3x)^2-2L^3\tau/(UG)\}^{1/2}]/2.$$

According to the embodiment as described above, the stress acting on each piezoelectric body (15) for driving the drive beam (7) can be alleviated with reliability.

3. Furthermore, the above-described optical scanning device 1 includes the following embodiment.

The piezoelectric portion (12) includes: a lower electrode (13) formed between a lower surface of each of the piezoelectric bodies (15) and the beam body (7a); and an upper electrode (17) formed to be in contact with an upper surface of each of the piezoelectric bodies (15).

4. Furthermore, the above-described optical scanning device 1 includes the following embodiment.

The grooves (18a, 18b) each have a depth that reaches an interface between each of the piezoelectric bodies (15) and the lower electrode (13).

According to the embodiment as described above, a lower electrode (13) common to the piezoelectric bodies (15) obtained by partitioning is provided, so that complication of the interconnection can be prevented.

5. Furthermore, the above-described optical scanning device 1 includes the following embodiment.

The grooves (18a, 18b) each have a depth that reaches the beam body (7a).

6. The method of manufacturing an optical scanning device 1 as described above is implemented in the following embodiment.

A method of manufacturing an optical scanning device is provided, which includes a drive beam (7) configured to drive a reflector (3) through a link beam (9), the reflector (3) having a reflection surface (5) on which light is reflected.

Forming the drive beam (7) and the reflector (3) includes: preparing a substrate (21); forming a first conductive film (33) so as to cover the substrate (21); forming a piezoelectric film (35) so as to cover the first conductive film (33); forming a second conductive film (37) so as to cover the piezoelectric film (35); by processing each of the second conductive film (37), the piezoelectric film (35) and the first conductive film (33), forming a piezoelectric portion (12) including piezoelectric bodies (15); and, by processing the substrate (21), forming the reflector (3) and the link beam (9), and forming a beam body (7a) having one end that is fixed to the substrate (21) and the other end that is connected to the reflector (3) through the link beam (9), the beam body (7a) being in contact with the piezoelectric portion (12).

The forming a piezoelectric portion (12) includes obtaining the piezoelectric bodies (15) partitioned by providing grooves (18a, 18b) in the piezoelectric film (35), the grooves (18a, 18b) including a plurality of first grooves (18a) that extend in a first direction and that are spaced apart from each other in a second direction crossing the first direction.

In the obtaining the piezoelectric bodies (15) partitioned by providing grooves (18a, 18b), the piezoelectric bodies (15) are disposed to be reduced in length in the second direction as the piezoelectric bodies (15) approach a portion at the one end of the beam body (7a), and the piezoelectric bodies (15) are reduced in length in the second direction as the piezoelectric bodies (15) approach a portion at the other end of the beam body (7a).

According to the embodiment as described above, it becomes possible to manufacture an optical scanning device that allows alleviation of the stress that acts on each piezoelectric body (15) for driving the drive beam (7).

7. The above-described method of manufacturing an optical scanning device 1 includes the following embodiment.

In the obtaining the piezoelectric bodies (15) partitioned by providing grooves (18a, 18b), the grooves (18a, 18b) each are formed so as to reach the first conductive film (33).

According to the embodiment as described above, a lower electrode (13) common to the piezoelectric bodies (15) obtained by partitioning is formed, so that complication of the interconnection can be prevented.

Second Embodiment

Then, an optical scanning device according to the second embodiment will be hereinafter described.

Figure 19:
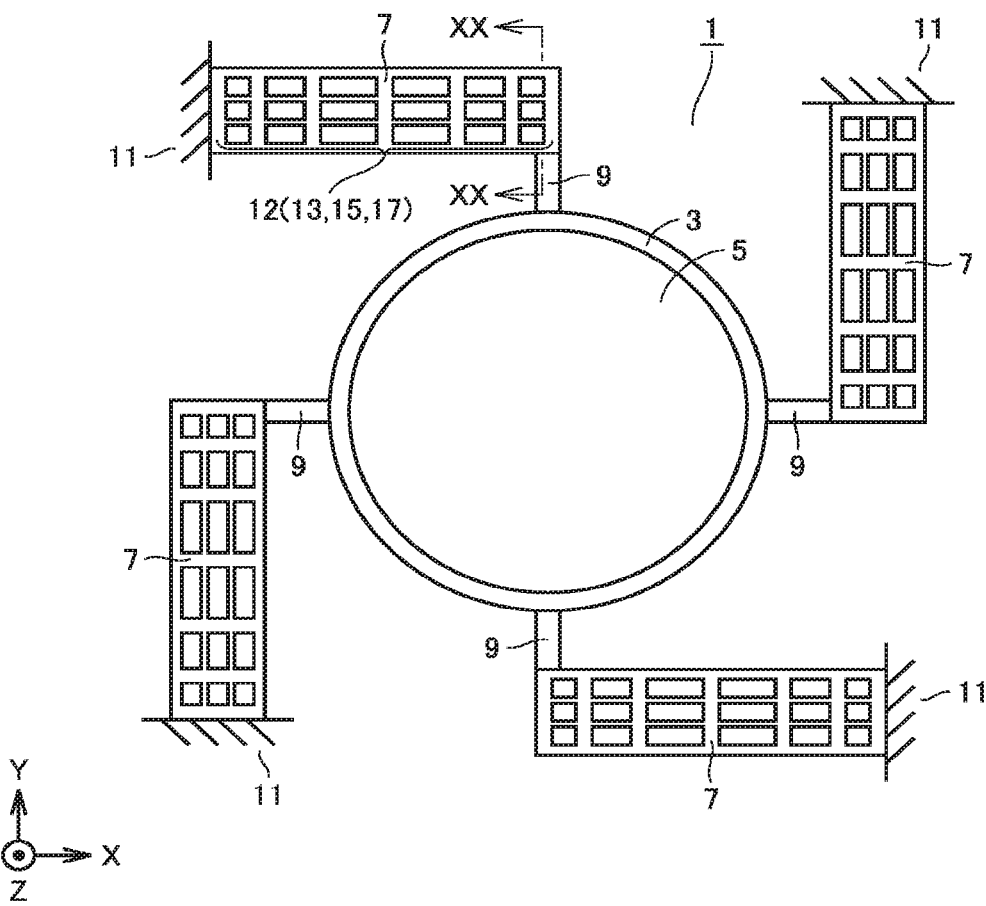
FIG. 19 is a plan view of an optical scanning device according to the second embodiment of the present invention.
Figure 20:
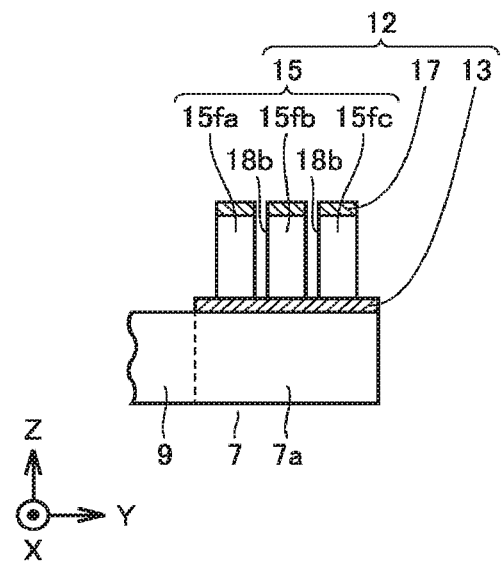
FIG. 20 is a cross-sectional view taken along a cross-sectional line XX-XX shown in FIG. 19 in the second embodiment.

As shown in FIGS. 19 and 20, a piezoelectric portion 12 of an optical scanning device 1 is partitioned by a plurality of second grooves 18b into a plurality of piezoelectric bodies 15 (15fa, 15fb, 15fc), the plurality of second grooves 18b being formed to extend in the X-axis direction and to be spaced apart from each other in the Y-axis direction. In other words, piezoelectric portion 12 (piezoelectric body 15) is partitioned in the long-side direction of a drive beam 7 and partitioned also in the short-side direction (the width direction) of drive beam 7. Since the configurations other than the above are similar to those of optical scanning device 1 shown in FIGS. 1 and 2, the same components will be designated by the same reference characters, and description thereof will not be repeated unless otherwise required.

When drive beam 7 only moves to be displaced simply up and down, piezoelectric portion 12 (piezoelectric body 15) does not need to be partitioned also in the width direction. However, as shown in FIG. 19, link beam 9 is connected to the drive end of drive beam 7. Link beam 9 is connected to drive beam 7 along the short-side direction of drive beam 7. Accordingly, when drive beam 7 is displaced up and down, torsion force is applied to drive beam 7 through link beam 9 connected to the drive end, so that drive beam 7 is twisted.

Thus, it can be said that the description about the stress occurring in the long-side direction of drive beam 7 can be applied also to the short-side direction (the width direction) of drive beam 7. Accordingly, by partitioning piezoelectric portion 12 (piezoelectric body 15) also in the width direction, the stress occurring in the width direction of piezoelectric portion 12 (piezoelectric body 15) can be reduced.

Figure 21:
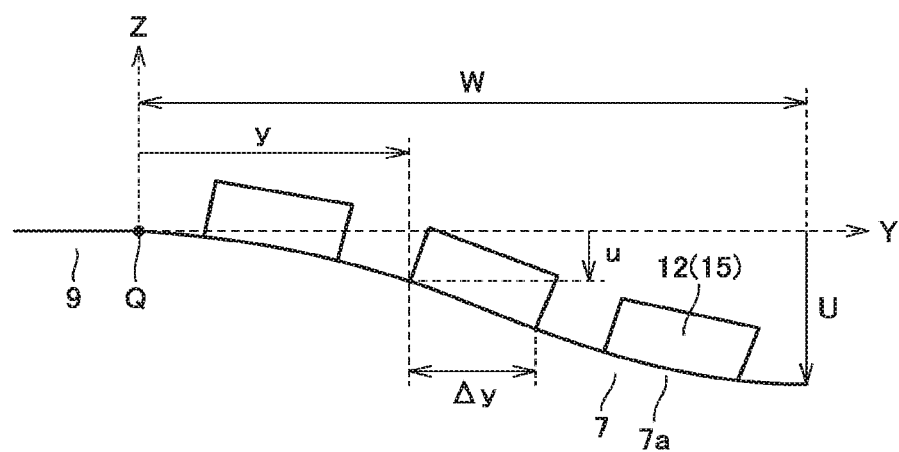
FIG. 21 is a partially enlarged side view showing coordinates and the length relation for illustrating the partitioning length along which a piezoelectric portion is partitioned, in the second embodiment.

FIG. 20 shows the case where piezoelectric bodies 15fa, 15fb and 15fc are formed to have approximately the same length in the Y-axis direction (the width direction), but piezoelectric bodies 15 may be reduced in length in the Y-axis direction as piezoelectric bodies 15 approach the portion to which link beam 9 is connected. As shown in FIG. 21, while the interface of the portion of drive beam 7 to which link beam 9 is connected is defined as a reference position Q, it is assumed that, in the state where drive beam 7 is not displaced, the short-side direction in which drive beam 7 extends is defined as a Y-axis, the height direction is defined as a Z-axis, and the length (width) of drive beam 7 in the Y-axis direction is defined as W.

Furthermore, in the state where drive beam 7 is displaced, it is assumed that the displacement in the Z-axis direction from reference position Q to the interface at the opposite end of drive beam 7 is defined as U, the distance from reference position Q in the Y-axis direction is defined as y, and the displacement in the Z-axis direction from reference position Q at distance y to the interface is defined as u. Thus, by the calculation similar to that performed for the long-side direction of drive beam 7, a partitioning length Δy in the short-side direction is represented by the following (equation 8).

$$\Delta y=[(3W/2-3y)-\{(3W/2-3y)^2-2W^3\tau/(UG)\}^{1/2}]/2 \qquad \text{(equation 8)}$$

The following is an explanation about an example of the pattern of piezoelectric bodies 15 on drive beam 7 based on above-mentioned findings.

Figure 22:
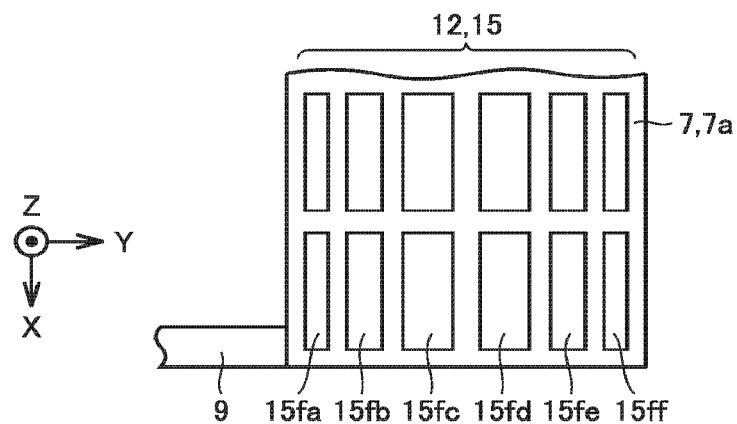
FIG. 22 is the first partial plan view showing a variation of an arrangement pattern of the piezoelectric portion in the drive beam in the second embodiment.

In drive beam 7 shown in FIG. 22, piezoelectric bodies 15 obtained by partitioning in the Y-axis direction (the short-side direction, the width direction) and including piezoelectric bodies 15fa, 15fb, 15fc, 15fd, 15fe, and 15ff are disposed. Piezoelectric bodies 15fc and 15fd are disposed in the center portion of beam body 7a in the Y-axis direction. Piezoelectric bodies 15fa and 15fb are disposed on the side of beam body 7a to which link beam 9 is connected. Piezoelectric bodies 15fe and 15ff are disposed on the side opposite to the side of beam body 7a to which link beam 9 is connected.

Each of piezoelectric bodies 15fa and 15fb is shorter in length in the Y-axis direction than each of piezoelectric bodies 15fc and 15fd. Furthermore, piezoelectric body 15fa is shorter in length in the Y-axis direction than piezoelectric body 15fb. Each of piezoelectric bodies 15fe and 15ff is shorter in length in the Y-axis direction than each of piezoelectric bodies 15fc and 15fd. Furthermore, piezoelectric body 15ff is shorter in length in the Y-axis direction than piezoelectric body 15fe.

Figure 23:
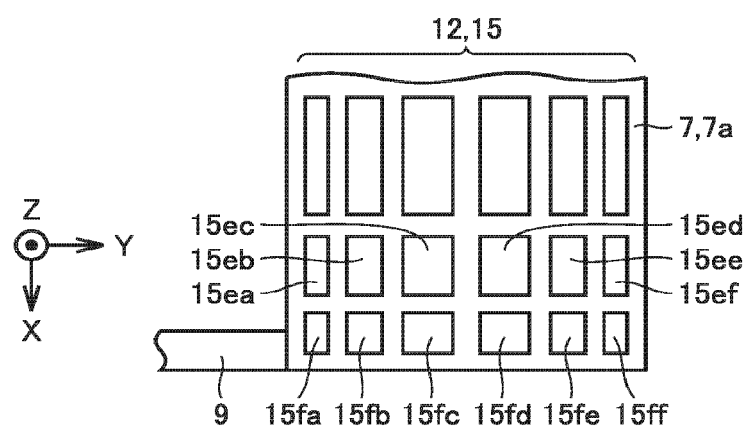
FIG. 23 is the second partial plan view showing a variation of an arrangement pattern of the piezoelectric portion in the drive beam in the second embodiment.

In drive beam 7 shown in FIG. 23, piezoelectric bodies 15 obtained by partitioning in the Y-axis direction (the short-side direction, the width direction) and including piezoelectric bodies 15fa, 15fb, 15fc, 15fd, 15fe, 15ff, and piezoelectric bodies 15ea, 15eb, 15ec, 15ed, 15ee, 15ef are disposed. The length relation among piezoelectric bodies 15fa to 15ff in the Y-axis direction shown in FIG. 22 is the same as that of each of piezoelectric bodies 15fa to 15ff and piezoelectric bodies 15ea to 15ef. Furthermore, in this drive beam 7, piezoelectric bodies 15fa, 15fb, 15fc, 15fd, 15fe, and 15ff are shorter in length in the X-axis direction than piezoelectric bodies 15ea, 15eb, 15ec, 15ed, 15ee and 15ef, respectively.

Figure 24:
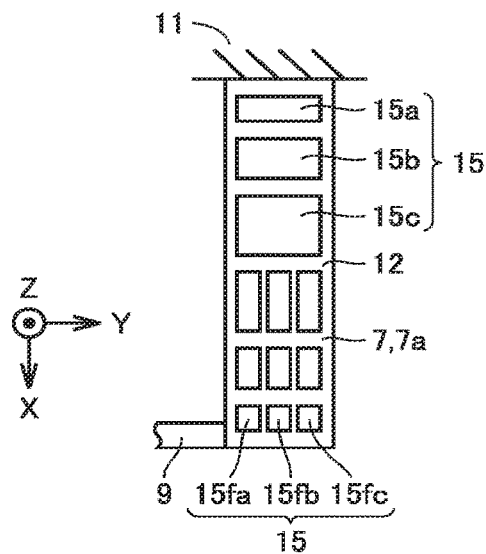
FIG. 24 is a plan view showing a variation of an arrangement pattern of the piezoelectric portion in the drive beam in the second embodiment.

In drive beam 7 shown in FIG. 24, piezoelectric portion 12 (piezoelectric body 15) shown in FIG. 19 and piezoelectric portion 12 (piezoelectric body 15) shown in FIG. 1 are combined. Piezoelectric portion 12 (piezoelectric bodies 15a, 15b, and 15c) is disposed in the region of drive beam 7 from its center portion to the fixed end side in the long-side direction. Piezoelectric portion 12 (piezoelectric bodies 15fa, 15fb, 15fc) is disposed in the region of drive beam 7 from its center portion to the drive end side in the long-side direction.

In drive beam 7 of optical scanning device 1 as described above, piezoelectric portion 12 (piezoelectric body 15) is partitioned in the long-side direction and also partitioned in the short-side direction (the width direction). Thereby, the stress occurring in piezoelectric portion 12 (piezoelectric body 15) in the width direction can be reduced.

(Embodiment of Optical Scanning Device and Manufacturing Method Thereof)

1. The above-described optical scanning device 1 is implemented in the following embodiment.

The grooves (18a, 18b) include a plurality of second grooves (18b) that extend in the second direction and that are spaced apart from each other in the first direction.

The piezoelectric bodies (15) are further partitioned by the second grooves (18b).

2. Furthermore, the above-described optical scanning device 1 includes the following embodiment.

The link beam (9) is connected to the drive end from the first direction.

The piezoelectric bodies (15) are disposed to be reduced in length in the first direction as the piezoelectric bodies (15) approach a portion of the drive end to which the link beam (9) is connected.

According to the embodiment as described above, the stress that acts on each piezoelectric body (15) for driving the drive beam (7) can be more effectively alleviated.

3. The method of manufacturing an optical scanning device 1 as described above is implemented in the following embodiment.

In the obtaining the piezoelectric bodies (15) partitioned by providing grooves (18a, 18b), the piezoelectric bodies (15) are further partitioned by providing a plurality of second grooves (18b) that extend in the second direction and that are spaced apart from each other in the first direction.

The piezoelectric bodies (15) are disposed to be reduced in length in the first direction as the piezoelectric bodies (15) approach a portion of the beam body (7a) that is connected to the link beam (9).

According to the embodiment as described above, it becomes possible to manufacture an optical scanning device that allows more effective alleviation of the stress that acts on each piezoelectric body (15) for driving the drive beam (7).

Third Embodiment

Then, a drive beam in an optical scanning device according to the third embodiment will be hereinafter described.

Figure 25:
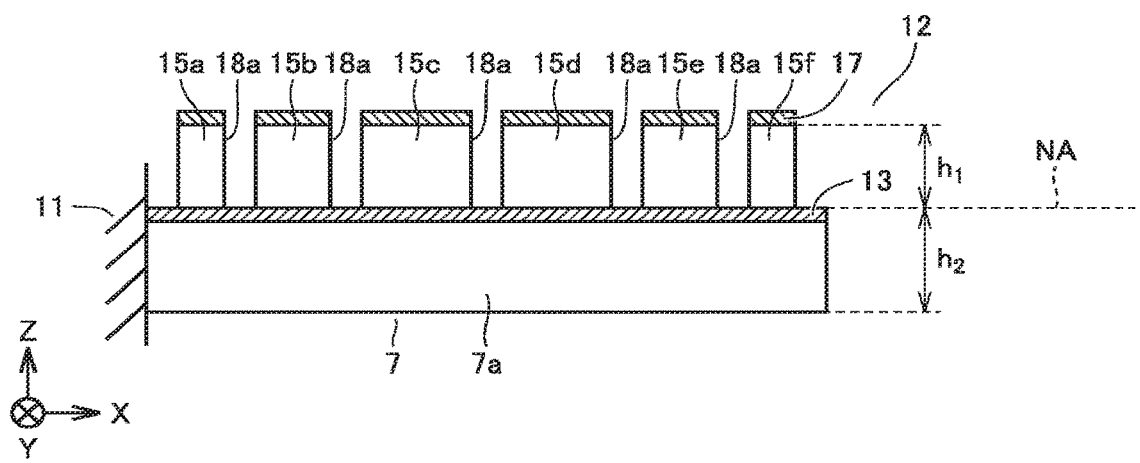
FIG. 25 is a cross-sectional view of a drive beam in an optical scanning device according to the third embodiment of the present invention.

As shown in FIG. 25, in a drive beam 7, the interface between a piezoelectric body 15 of a piezoelectric portion 12 and a lower electrode 13 coincides with a neutral axis NA. Since the configurations other than the above are similar to those of drive beam 7 in optical scanning device 1 shown in FIG. 1 and the like, the same components will be designated by the same reference characters, and description thereof will not be repeated unless otherwise required.

As described above, neutral axis NA represents an axis (plane) along which no compression stress and no tensile stress occur when a bending moment acts on drive beam 7. Along the neutral axis, the generated stress is theoretically zero. In this case, it is assumed that the thickness of piezoelectric body 15 is defined as $h_1$, the Young's modulus of piezoelectric body 15 is defined as $E_1$, the thickness of beam body 7a and lower electrode 13 is defined as $h_2$, and the Young's modulus of beam body 7a and lower electrode 13 is defined as $E_2$. In order to allow the interface between piezoelectric body 15 and lower electrode 13 to coincide with neutral axis NA, thicknesses $h_1$ and $h_2$ may be set to satisfy the following (equation 9).

$$(h_2/h_1)^2 = E_1/E_2 \qquad \text{(equation 9)}$$

For example, it is assumed that thickness $h_1$ of piezoelectric body 15 is set at 3 μm in the case where piezoelectric body 15 is made of PZT, beam body 7a is made of silicon, Young's modulus $E_1$ is set at 77.6 GPa, Young's modulus $E_2$ is set at 131 GPa. In this case, thickness $h_2$ of beam body 7a and lower electrode 13 is set at 2.3 μm. Thickness $h_1$ and thickness $h_2$ are set at their respective estimated thicknesses, thereby allowing the interface between piezoelectric body 15 and lower electrode 13 to coincide with neutral axis NA.

In the above-described optical scanning device 1, the interface between piezoelectric body 15 and lower electrode 13 in drive beam 7 is allowed to coincide with neutral axis NA, so that the stress occurring in beam body 7a of drive beam 7 can be further reduced.

(Embodiment of Optical Scanning Device and Manufacturing Method Thereof)

1. The above-described optical scanning device 1 is implemented in the following embodiment.

A neutral axis (NA) is located along an interface between each of the piezoelectric bodies (15) and the lower electrode (13).

According to the embodiment described above, the stress occurring in the beam body (7a) can be further reduced.

Fourth Embodiment

Then, a drive beam in an optical scanning device according to the fourth embodiment will be hereinafter described.

Figure 26:
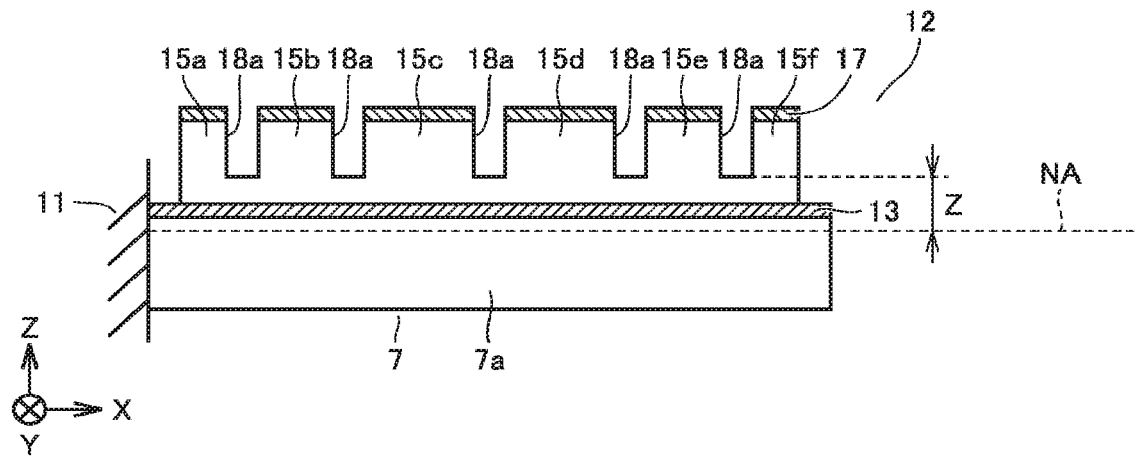
FIG. 26 is a cross-sectional view of a drive beam in an optical scanning device according to the fourth embodiment of the present invention.

As shown in FIG. 26, in a drive beam 7, the depth of a first groove 18a is shallower than the interface between piezoelectric body 15 and lower electrode 13. First groove 18a is formed from the surface of upper electrode 17 to partway through piezoelectric body 15 in the thickness direction. Since the configurations other than the above are similar to those of drive beam 7 of optical scanning device 1 shown in FIG. 1 and the like, the same components will be designated by the same reference characters, and description thereof will not be repeated unless otherwise required.

As described above, the stress generated in piezoelectric body 15 is increased toward the surface of piezoelectric body 15. When the generated stress exceeds the fracture stress by which piezoelectric body 15 is broken, piezoelectric body 15 is broken.

Thus, in drive beam 7, a first groove 18a is formed in a region in which the stress equal to or greater than the fracture stress is assumed to occur (hereinafter referred to as a region A). First groove 18a is formed from the surface of piezoelectric body 15 to the depth reaching region A. First groove 18a is not formed at the position deeper than region A.

In this case, fracture stress is defined as $\sigma_{max}$, and the stress occurring in piezoelectric portion 12 (piezoelectric body 15) is defined as $\sigma$. Also as shown in FIG. 26, the length along the Z-axis direction from neutral axis NA is defined as z. Thus, based on the relation represented in the (equation 1), distance z from neutral axis NA that satisfies the following (equation 10) is obtained.

$$\sigma = 6Ez(2x-L)U/L^3 < \sigma_{max} \quad \text{(equation 10)}$$

Accordingly, first groove 18*a* is formed from the surface of piezoelectric portion 12 to the position at distance z (hereinafter referred to as a position A) from neutral axis NA, but first groove 18*a* does not have to be formed in the region deeper than this position A.

In piezoelectric body 15 of optical scanning device 1 as described above, a portion of piezoelectric body 15 (piezoelectric film 35 (see FIG. 4)) remains from position A to the interface between piezoelectric body 15 and lower electrode 13. Thereby, the stress occurring in drive beam 7 can be reduced while ensuring the driving force achieved by the piezoelectric effect.

In addition, each of the above-described optical scanning device 1 and optical scanning devices 1 according to the second and third embodiments can be manufactured particularly by changing the pattern in which the piezoelectric film is patterned or by changing the depth of the groove in a series of manufacturing steps, which have been described in the first embodiment.

(Embodiment of Optical Scanning Device and Manufacturing Method Thereof)

1. The above-described optical scanning device 1 is implemented in the following embodiment.

The grooves (18*a*, 18*b*) each have a depth shallower than a position of an interface between each of the piezoelectric bodies (15) and the lower electrode (13).

According to the present embodiment, the stress occurring in the drive beam (7) can be reduced while ensuring the driving force achieved by the piezoelectric effect of the piezoelectric body (15).

2. The above-described method of manufacturing an optical scanning device 1 is implemented in the following embodiment.

In the obtaining the piezoelectric bodies (15) partitioned by providing grooves (18*a*, 18*b*), the grooves (18*a*, 18*b*) each are formed to extend partway through the piezoelectric film (35).

According to the embodiment as described above, it becomes possible to manufacture an optical scanning device by which the stress occurring in the drive beam (7) can be reduced while ensuring the driving force achieved by the piezoelectric effect of the piezoelectric body (15).

Fifth Embodiment

Then, an optical scanning device according to the fifth embodiment will be hereinafter described.

Figure 27:
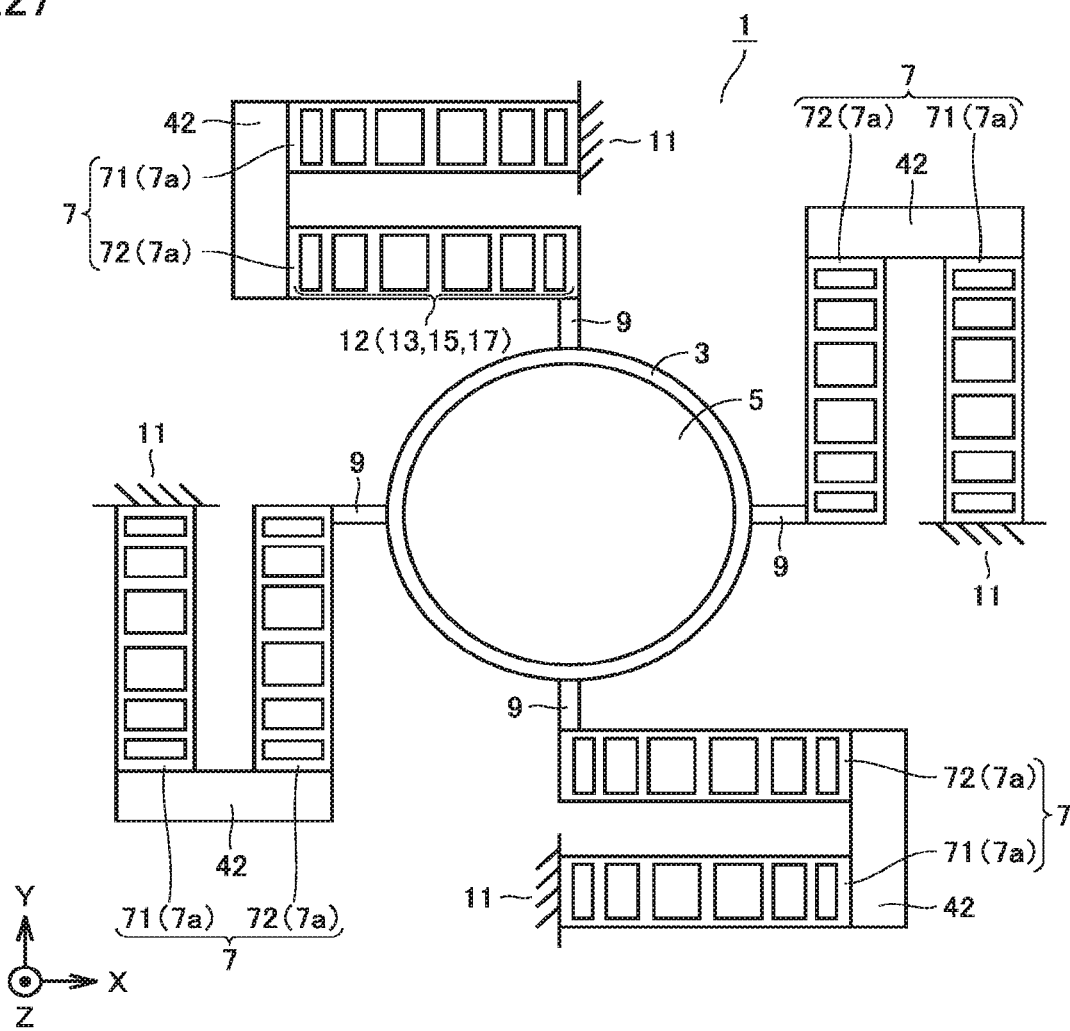
FIG. 27 is a plan view of an optical scanning device according to the fifth embodiment of the present invention.

As shown in FIG. 27, a drive beam 7 includes a first drive beam 71 and a second drive beam 72. First drive beam 71 and second drive beam 72 are disposed so as to be bent through a coupling portion 42.

First drive beam 71 has one end fixed as a fixed end to an anchor 11, and the other end connected to coupling portion 42. Second drive beam 72 has one end connected to coupling portion 42 and the other end connected as a drive end to a mirror 3 through a link beam 9.

For example, drive beam 7 located in the upper area as seen in the sheet of paper showing the figure (FIG. 27) will be more specifically described by way of example. In drive beam 7, first drive beam 71 and second drive beam 72 extend in the X-axis direction (the long-side direction). First drive beam 71 and second drive beam 72 are spaced apart from each other in the Y-axis direction.

In first drive beam 71, piezoelectric bodies 15 is provided to be reduced in length in the X-axis direction as approaching the other end side connected to coupling portion 42. In second drive beam 72, piezoelectric bodies 15 are provided to be reduced in length in the X-axis direction as piezoelectric bodies 15 approach the one end side connected to coupling portion 42. Since the configurations other than the above are similar to those of drive beam 7 of optical scanning device 1 shown in FIG. 1 and the like, the same components will be designated by the same reference characters, and description thereof will not be repeated unless otherwise required.

In the above-described optical scanning device 1, a bent beam including first drive beam 71 and second drive beam 72 that are bent through coupling portion 42 is applied as drive beam 7. In such a drive beam 7, also on the other end side of first drive beam 71 connected to coupling portion 42, the stress occurring in first drive beam 71 is increased toward the other end side, in the same manner as with the one end side of first drive beam 71 fixed to anchor 11.

Furthermore, also on the one end side of second drive beam 72 connected to coupling portion 42, the stress occurring in second drive beam 72 is increased toward the one end side, in the same manner as with the other end side of second drive beam 72 connected to link beam 9.

Accordingly, in first drive beam 71, it is desirable that piezoelectric bodies 15 are provided to be reduced in length (in the extending direction) as piezoelectric bodies 15 approach the one end side connected to coupling portion 42. Also, in second drive beam 72, it is desirable that piezoelectric bodies 15 are provided to be reduced in length (in the extending direction) as piezoelectric bodies 15 approach the other end side connected to coupling portion 42.

In each of first drive beam 71 and second drive beam 72, the partitioning length for piezoelectric bodies 15 can be calculated using the above-mentioned (equation 7). In other words, for first drive beam 71, the difference between the displacement of the one end side of first drive beam 71 in the Z-axis direction and the displacement of the other end side of first drive beam 71 in the Z-axis direction in the state where drive beam 7 is displaced is substituted as displacement U in the (equation 7), with the result that partitioning length Δx for piezoelectric bodies 15 can be calculated.

Furthermore, for second drive beam 72, the difference between the displacement of the one end side of second drive beam 72 in the Z-axis direction and the displacement of the other end side of second drive beam 72 in the Z-axis direction in the state where drive beam 7 is displaced is substituted as displacement U in the (equation 7), with the result that partitioning length Δx for piezoelectric bodies 15 can be calculated.

In first drive beam 71 of optical scanning device 1 as described above, piezoelectric bodies 15 are provided to be reduced in length as piezoelectric bodies 15 approach the one end side connected to coupling portion 42. Furthermore, in second drive beam 72, piezoelectric bodies 15 are provided to be reduced in length as piezoelectric bodies 15 approach the other end side connected to coupling portion 42.

Thereby, also in the optical scanning device to which a bent beam is applied, the stress occurring in each of first drive beam 71 and second drive beam 72 can be effectively alleviated.

(Embodiment of Optical Scanning Device)

Optical scanning device 1 as described above is implemented in the following embodiment.

The drive beam (7, 71, 72) is bent through a coupling portion (42) provided between the one end and the other end.

In the drive beam (7, 71, 72), the piezoelectric bodies (12) are disposed to be reduced in length in the second direction as the piezoelectric bodies (12) approach the coupling portion (42).

According to the embodiment as described above, also in the case of the bent beam, the stress that acts on each of the piezoelectric bodies (15) can be more effectively alleviated when the drive beam (7) is driven.

(Modification of Each Embodiment)

Figure 28:
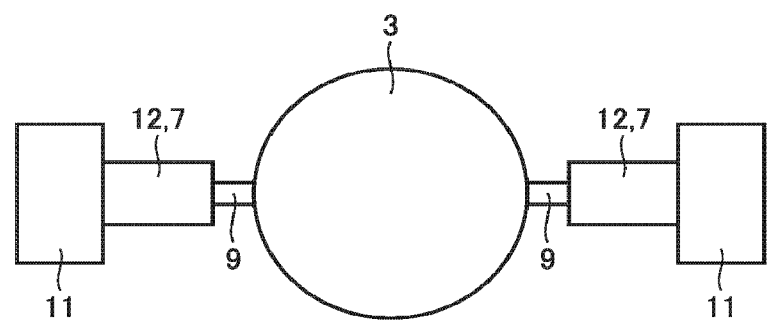
FIG. 28 is a plan view showing the concept of an optical scanning device according to a variation in each of the embodiments.
Figure 29:
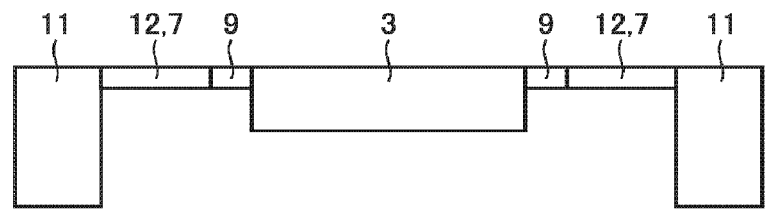
FIG. 29 is a side view showing the concept of the optical scanning device shown in FIG. 28 in each of the embodiments.

In optical scanning device 1 according to each embodiment, four drive beams 7 are connected to mirror 3, but the number of drive beams 7 is not limited to four (see FIG. 1 and the like). In this case, an explanation will be hereinafter given as one of modifications with regard to an optical scanning device in which two drive beams are connected to a mirror. FIGS. 28 and 29 each show a schematic diagram of the optical scanning device.

As shown in FIGS. 28 and 29, a drive beam 7 is connected through a link beam 9 to each of the first position on the outer circumference of a mirror 3 and the second position on the outer circumference across the center portion from the first position. Drive beam 7 is provided with a piezoelectric portion 12 partitioned by grooves to include a plurality of piezoelectric bodies. Since the configurations other than the above are similar to those of optical scanning device 1 shown in FIG. 1 and the like, the same components are designated by the same reference characters. In the case of this optical scanning device, mirror 3 is operated to rotate about one axis.

Furthermore, three or more drive beams 7 may be connected to mirror 3. In this case, by adjusting the phase at which the drive beam is vibrated, mirror 3 can be freely inclined over its entire circumference. For example, when four drive beams 7 are connected to mirror 3 (see FIG. 1 and the like), the phase at which drive beam 7 is vibrated is shifted by 90°, so that mirror 3 can also be vibrated to perform precession. Furthermore, by causing vibrations while shifting the operating frequency of each drive beam 7, mirror 3 can be operated to perform a Lissajous movement.

The optical scanning devices having been described in each of the embodiments can be variously combined with one another as required. The numerical values of the thickness or the dimensions of each component in the optical scanning device are merely by way of example and not limited to the numerical values as mentioned above.

The embodiments disclosed herein are merely by way of example and not limited thereto. The scope of the present invention is defined by the terms of the claims, rather than the description above, and is intended to include any modifications within the meaning and scope equivalent to the terms of the claims.

INDUSTRIAL APPLICABILITY

The present invention is effectively utilized in an optical scanning device in which a reflector is driven by a drive beam to which a piezoelectric body is applied.

REFERENCE SIGNS LIST 1 optical scanning device, 3 mirror, 5 reflecting mirror, 7 drive beam, 7a beam body, 9 link beam, 11 anchor, 12 piezoelectric portion, 13 lower electrode, 15, 15a, 15b, 15c, 15d, 15e, 15f, 15fa, 15fb, 15fc, 15fd, 15fe, 15ff, 15ea, 15eb, 15ec, 15ed, 15ee, 15ef piezoelectric body, 17 upper electrode, 18a first groove, 18b second groove, 21 SOI substrate, 23 silicon substrate, 25 silicon oxide film, 27 silicon layer, 29 silicon oxide film, 31 oxide film on backside surface, 33 first conductive film, 35 piezoelectric film, 37 second conductive film, 39 insulating film, 41 wiring electrode, 42 coupling portion, 71 first drive beam, 72 second drive beam, P, Q reference position, NA neutral axis.

The invention claimed is:

1. An optical scanning device comprising:
a reflector having a reflection surface on which light is reflected; and
a drive beam having one end and the other end, the one end being fixed as a fixed end, and the other end being connected as a drive end to the reflector through a link beam,
the drive beam including
a beam body having a width in a first direction and extending in a second direction crossing the first direction, and
a piezoelectric portion formed to be in contact with the beam body, wherein
the piezoelectric portion is partitioned by grooves to include a plurality of piezoelectric bodies that are independently provided on the beam body, the grooves including a plurality of first grooves that extend in the first direction and that are spaced apart from each other in the second direction,
the plurality of piezoelectric bodies that are independently provided on the beam body include a first plurality of piezoelectric bodies in a first region closest to the fixed end, a second plurality of piezoelectric bodies in a second region closest to the drive end, and a third plurality of piezoelectric bodies in a third region between the first region and the second region, and
each of the first plurality of piezoelectric bodies in the first region are disposed to be reduced in length compared to an adjacent piezoelectric body in the second direction as the piezoelectric bodies approach the fixed end, and each of the second piezoelectric bodies in the second region are disposed to be reduced in length compared to an adjacent piezoelectric body in the second direction as the piezoelectric bodies approach the drive end, and piezoelectric bodies having different shapes are included in the drive beam.

2. The optical scanning device according to claim 1, wherein
while the fixed end in the drive beam is defined as a reference position,
assuming that, in a state where the drive beam is not displaced, the second direction in which the drive beam extends is defined as an X-axis direction, a direction crossing the first direction and the second direction is defined as a Z-axis direction, a length of the drive beam in the X-axis direction is defined as L, and a distance from the reference position in the X-axis direction is defined as x, and
assuming that, in a state where the drive beam is displaced, a displacement from the reference position to the drive end in the Z-axis direction is defined as U, a modulus of transverse elasticity of each of the piezoelectric bodies is defined as G, a shearing stress occurring in each of the piezoelectric bodies is defined as t, and a length of each of the piezoelectric bodies in the X-axis direction that are obtained by partitioning and located at the distance x is defined as Δx, the Δx is set to be equal to or less than a length calculated by a following equation:

$$\Delta x=[(3L/2-3x)-\{(3L/2-3x)^2-2L^3\tau/(UG)\}^{1/2}]/2.$$

3. The optical scanning device according to claim 1, wherein
the grooves include a plurality of second grooves that extend in the second direction and that are spaced apart from each other in the first direction, and
the piezoelectric bodies are further partitioned by the second grooves.

4. The optical scanning device according to claim 3, wherein
the link beam is connected to the drive end from the first direction, and
the piezoelectric bodies are disposed to be reduced in length in the first direction as the piezoelectric bodies approach a portion of the drive end to which the link beam is connected.

5. The optical scanning device according to claim 1, wherein
the drive beam is bent through a coupling portion provided between the one end and the other end, and
in the drive beam, the piezoelectric bodies are disposed to be reduced in length in the second direction as the piezoelectric bodies approach the coupling portion.

6. The optical scanning device according to claim 1, wherein
the piezoelectric portion includes
a lower electrode formed between a lower surface of each of the piezoelectric bodies and the beam body, and
an upper electrode formed to be in contact with an upper surface of each of the piezoelectric bodies.

7. The optical scanning device according to claim 6, wherein a neutral axis is located along an interface between each of the piezoelectric bodies and the lower electrode.

8. The optical scanning device according to claim 6, wherein the grooves each have a depth that reaches an interface between each of the piezoelectric bodies and the lower electrode.

9. The optical scanning device according to claim 6, wherein the grooves each have a depth shallower than a position of an interface between each of the piezoelectric bodies and the lower electrode.

10. The optical scanning device according to claim 6, wherein the grooves each have a depth that reaches the beam body.

11. A method of manufacturing an optical scanning device that includes a drive beam configured to drive a reflector through a link beam, the reflector having a reflection surface on which light is reflected, forming the drive beam and the reflector comprising:
preparing a substrate;
forming a first conductive film so as to cover the substrate;
forming a piezoelectric film so as to cover the first conductive film;
forming a second conductive film so as to cover the piezoelectric film;
by processing each of the second conductive film, the piezoelectric film, and the first conductive film, forming a piezoelectric portion including piezoelectric bodies; and,
by processing the substrate, forming the reflector and the link beam, and forming a beam body having one end that is fixed to the substrate and the other end that is connected to the reflector through the link beam, the beam body being in contact with the piezoelectric portion, wherein
the forming a piezoelectric portion includes obtaining the piezoelectric bodies partitioned by providing grooves in the piezoelectric film so that the piezoelectric bodies are independently provided on the beam body, the grooves including a plurality of first grooves that extend in a first direction and that are spaced apart from each other in a second direction crossing the first direction,
in the obtaining the piezoelectric bodies partitioned by providing grooves, the plurality of piezoelectric bodies that are independently provided on the beam body include a first plurality of piezoelectric bodies in a first region closest to the one end, a second plurality of piezoelectric bodies in a second region closest to the other end, and a third plurality of piezoelectric bodies in a third region between the first region and the second region, and
each of the first plurality of piezoelectric bodies in the first region are disposed to be reduced in length compared to an adjacent piezoelectric body in the second direction as the piezoelectric bodies approach a portion at the one end of the beam body, and each of the second piezoelectric bodies are disposed to be reduced in length compared to an adjacent piezoelectric body in the second direction as the piezoelectric bodies approach a portion at the other end of the beam body so that piezoelectric bodies having different shapes are included in the drive beam.

12. The method of manufacturing an optical scanning device according to claim 11, wherein
in the obtaining the piezoelectric bodies partitioned by providing grooves,
the piezoelectric bodies are further partitioned by providing a plurality of second grooves that extend in the second direction and that are spaced apart from each other in the first direction, and
the piezoelectric bodies are disposed to be reduced in length in the first direction as the piezoelectric bodies approach a portion of the beam body that is connected to the link beam.

13. The method of manufacturing an optical scanning device according to claim 11, wherein
in the obtaining the piezoelectric bodies partitioned by providing grooves, the grooves each are formed so as to reach the first conductive film.

14. The method of manufacturing an optical scanning device according to claim 11, wherein
in the obtaining the piezoelectric bodies partitioned by providing grooves, the grooves each are formed to extend partway through the piezoelectric film.

* * * * *